(12) United States Patent
Mizusawa et al.

(10) Patent No.: US 9,640,478 B2
(45) Date of Patent: May 2, 2017

(54) SEMICONDUCTOR DEVICE HAVING LOW DIELECTRIC INSULATING FILM AND MANUFACTURING METHOD OF THE SAME

(71) Applicant: TERA PROBE, INC., Yokohama, Kanagawa (JP)

(72) Inventors: Aiko Mizusawa, Kunitachi (JP); Osamu Okada, Hamura (JP); Takeshi Wakabayashi, Sayama (JP); Ichiro Mihara, Tachikawa (JP)

(73) Assignee: AOI ELECTRONICS CO., LTD., Kagawa (JP)

(\*) Notice: Subject to any disclaimer, the term of this patent is extended or adjusted under 35 U.S.C. 154(b) by 151 days.

(21) Appl. No.: 14/750,665

(22) Filed: Jun. 25, 2015

(65) Prior Publication Data

US 2015/0318244 A1 Nov. 5, 2015

Related U.S. Application Data

(60) Division of application No. 14/497,944, filed on Sep. 26, 2014, now Pat. No. 9,070,638, which is a division
(Continued)

(30) Foreign Application Priority Data

Sep. 21, 2007 (JP) .................................. 2007-244977
Feb. 28, 2008 (JP) .................................. 2008-047090

(51) Int. Cl.
*H01L 23/488* (2006.01)
*H01L 23/522* (2006.01)
(Continued)

(52) U.S. Cl.
CPC .......... *H01L 23/5226* (2013.01); *H01L 21/78* (2013.01); *H01L 23/296* (2013.01);
(Continued)

(58) Field of Classification Search
CPC ...... H01L 23/488; H01L 21/762; H01L 24/12
See application file for complete search history.

(56) References Cited

U.S. PATENT DOCUMENTS 6,274,514 B1   8/2001   Jang et al.
6,476,491 B2   11/2002  Harada et al.
(Continued)

FOREIGN PATENT DOCUMENTS

EP   1 298 725 A3   4/2003
EP   1 737 037 A3   12/2006
(Continued)

OTHER PUBLICATIONS

Japanese Office Action dated May 25, 2010, and English translation thereof in Japanese Application No. 2008-224341, which is a Japanese counterpart of related U.S. Appl. No. 12/412,576.
(Continued)

*Primary Examiner* — Matthew Landau
*Assistant Examiner* — Krista Soderholm
(74) *Attorney, Agent, or Firm* — Holtz, Holtz & Volek PC

(57) ABSTRACT

A semiconductor device includes a semiconductor substrate on which a structure portion is provided except a peripheral portion thereof, and has a laminated structure including low dielectric films and wiring lines, the low dielectric films having a relative dielectric constant of 3.0 or lower and a glass transition temperature of 400° C. or higher. An insulating film is formed on the structure portion. A connection pad portion is arranged on the insulating film and connected to an uppermost wiring line of the laminated structure portion. A bump electrode is provided on the connection pad portion. A sealing film made of an organic resin is provided on a part of the insulating film which surrounds the bump electrode. Side surfaces of the laminated structure portion are covered with the insulating film and/or the sealing film.

20 Claims, 23 Drawing Sheets

Related U.S. Application Data of application No. 14/081,303, filed on Nov. 15, 2013, now Pat. No. 8,871,627, which is a continuation of application No. 12/156,822, filed on Jun. 4, 2008, now Pat. No. 8,587,124, which is a continuation-in-part of application No. 12/001,878, filed on Dec. 13, 2007, now abandoned.

(51) Int. Cl.

| | | |
|---|---|---|
| *H01L 23/528* | (2006.01) | |
| *H01L 23/532* | (2006.01) | |
| *H01L 23/00* | (2006.01) | |
| *H01L 23/31* | (2006.01) | |
| *H01L 21/78* | (2006.01) | |
| *H01L 23/29* | (2006.01) | |
| *H01L 23/525* | (2006.01) | |

(52) U.S. Cl.
CPC ...... *H01L 23/3114* (2013.01); *H01L 23/3171* (2013.01); *H01L 23/528* (2013.01); *H01L 23/53295* (2013.01); *H01L 23/564* (2013.01); *H01L 24/02* (2013.01); *H01L 24/11* (2013.01); *H01L 24/12* (2013.01); *H01L 24/14* (2013.01); *H01L 24/94* (2013.01); *H01L 23/3121* (2013.01); *H01L 23/525* (2013.01); *H01L 2224/0233* (2013.01); *H01L 2224/02331* (2013.01); *H01L 2224/0401* (2013.01); *H01L 2224/1147* (2013.01); *H01L 2224/12105* (2013.01); *H01L 2224/131* (2013.01); *H01L 2224/13014* (2013.01); *H01L 2224/13022* (2013.01); *H01L 2224/274* (2013.01); *H01L 2224/94* (2013.01); *H01L 2924/00013* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01022* (2013.01); *H01L 2924/01029* (2013.01); *H01L 2924/01033* (2013.01); *H01L 2924/01078* (2013.01); *H01L 2924/10253* (2013.01); *H01L 2924/12042* (2013.01); *H01L 2924/14* (2013.01); *H01L 2924/19043* (2013.01)

(56) References Cited

U.S. PATENT DOCUMENTS

| | | |
|---|---|---|
| 6,559,548 B1 | 5/2003 | Matsunaga et al. |
| 6,563,218 B2 | 5/2003 | Matsunaga et al. |
| 6,579,787 B2 | 6/2003 | Okura et al. |
| 6,770,971 B2 | 8/2004 | Kouno et al. |
| 6,989,600 B2 | 1/2006 | Kubo et al. |
| 7,042,081 B2 | 5/2006 | Wakisaka et al. |
| 7,064,440 B2 | 6/2006 | Jobetto et al. |
| 7,075,181 B2 | 7/2006 | Wakabayashi et al. |
| 7,176,572 B2 | 2/2007 | Hanaoka |
| 7,256,496 B2 | 8/2007 | Okada et al. |
| 7,294,922 B2 | 11/2007 | Jobetto et al. |
| 7,294,933 B2 | 11/2007 | Hanaoka |
| 7,407,879 B2 | 8/2008 | Nicholson et al. |
| 7,547,967 B2 | 6/2009 | Jobetto et al. |
| 7,602,779 B2 | 10/2009 | Kato et al. |
| 7,618,886 B2 | 11/2009 | Jobetto et al. |
| 7,816,790 B2 | 10/2010 | Mizusawa et al. |
| 2002/0024145 A1 | 2/2002 | Okura et al. |
| 2002/0100984 A1 | 8/2002 | Oshima et al. |
| 2003/0057557 A1 | 3/2003 | Matsunaga et al. |
| 2003/0148558 A1 | 8/2003 | Kubo et al. |
| 2005/0170641 A1 | 8/2005 | Kondo et al. |
| 2006/0012039 A1 | 1/2006 | Kim et al. |
| 2006/0060984 A1 | 3/2006 | Wakabayashi et al. |
| 2006/0166012 A1 | 7/2006 | Nicholson et al. |
| 2006/0186542 A1 | 8/2006 | Wakabayashi et al. |
| 2006/0273463 A1 | 12/2006 | Wakabayashi et al. |
| 2006/0291029 A1 | 12/2006 | Lin et al. |
| 2007/0267743 A1 | 11/2007 | Mizusawa et al. |
| 2009/0079072 A1 | 3/2009 | Mizusawa et al. |
| 2009/0243097 A1 | 10/2009 | Koroku et al. |

FOREIGN PATENT DOCUMENTS

| | | |
|---|---|---|
| JP | 59-222954 A | 12/1984 |
| JP | 10-032220 A | 2/1998 |
| JP | 11-214434 A | 8/1999 |
| JP | 2002-217198 A | 8/2002 |
| JP | 2003-298005 A | 10/2003 |
| JP | 2004-79928 A | 3/2004 |
| JP | 2004-158827 A | 6/2004 |
| JP | 2004-165658 A | 6/2004 |
| JP | 2004-349461 A | 12/2004 |
| JP | 2005-175317 A | 6/2005 |
| JP | 2005-347461 A | 12/2005 |
| JP | 2006-100535 A | 4/2006 |
| JP | 2006-352706 A | 12/2006 |
| JP | 2007-335830 A | 12/2007 |
| TW | 200405496 | 4/2004 |
| TW | 200614404 | 5/2006 |
| WO | WO 2005/024912 A2 | 3/2005 |
| WO | WO 2006/129832 A1 | 12/2006 |

OTHER PUBLICATIONS

Japanese Office Action dated Aug. 31, 2010, and English translation thereof in Japanese Application No. 2008-224341, which is a Japanese counterpart of related U.S. Appl. No. 12/412,576.

Chinese Office Action dated Jul. 9, 2010, and English translation thereof in Chinese Application No. 200910132909.1, which is a Chinese counterpart of related U.S. Appl. No. 12/412,576.

Korean Office Action dated Nov. 12, 2010, and English translation thereof in Korean Application No. 10-2009-0027020, which is a Korean counterpart of related U.S. Appl. No. 12/412,576.

Related U.S. Appl. No. 12/412,576; First named inventor: Taisuke Koroku; filed Mar. 27, 2009; Title"Semiconductor Device Having Low Dielectric Constant Film and Manufacturing Method Thereof."

Japanese Office Action dated Jun. 17, 2008 and English translation thereof that issued in Japanese Application No. 2006-316643, which is a counterpart of related U.S. Appl. No. 11/638,717.

Japanese Office Action dated Apr. 17, 2007 and English translation thereof that issued in Japanese Application No. 2006-316643, which is a counterpart of related U.S. Appl. No. 11/638,717.

Taiwanese Office Action dated Feb. 26, 2010 and English translation thereof that issued in Taiwanese Application No. 095146789, which is a counterpart of related U.S. Appl. No. 11/638,717.

International Search Report and Written Opinion dated May 4, 2007 (in English) that issued in International Application No. PCT/JP2006/325131, which is an International counterpart of related U.S. Appl. No. 11/638,717.

Related U.S. Appl. No. 11/638,717; First Named Inventor: Aiko Mizusawa; Title: "Semiconductor Device Having Low Dielectric Insulating Film and Manufacturing Method of the Same"; filed Dec. 14, 2006.

English Language International Search Report and Written Opinion dated Sep. 10, 2008 issued in International Appln. No. PCT/JP2008/060408 which is a counterpart of U.S. Appl. No. 12/001,878.

SEMICONDUCTOR DEVICE HAVING LOW DIELECTRIC INSULATING FILM AND MANUFACTURING METHOD OF THE SAME

CROSS-REFERENCE TO RELATED APPLICATIONS

This application is a Divisional of U.S. application Ser. No. 14/497,944, filed Sep. 26, 2014, which is a Divisional of U.S. application Ser. No. 14/081,303, filed Nov. 15, 2013, which is a Continuation of U.S. application Ser. No. 12/156, 822, filed Jun. 4, 2008, which is a Continuation-in-part of U.S. application Ser. No. 12/001,878, filed Dec. 13, 2007. The present application is based upon and claims the benefit of priority from prior Japanese Patent Applications No. 2007-244977, filed Sep. 21, 2007, and No. 2008-047090, filed Feb. 28, 2008, the entire contents of both of which are incorporated herein by reference.

BACKGROUND OF THE INVENTION

1. Field of the Invention

The present invention relates to a semiconductor device and a method for manufacturing the same, and particularly a semiconductor device having wiring lines on a low dielectric film.

2. Description of the Related Art

As semiconductor devices to be mounted on small-sized electronic devices represented by portable electronic devices and the like, there are known chip size packages (CSPs) each having dimensions substantially equal to that of a semiconductor substrate. Among the CSPs, a CSP in which packaging is completed in a wafer state and which is separated into individual semiconductor devices by dicing is also referred to as a wafer level package (WLP).

In the conventional semiconductor device as described above (refer to, for example, Jpn. Pat. Appln. KOKAI Publication No. 2004-349461), wiring lines are extended from connection pads on the upper surface of an insulating film which covers the connection pads formed on the semiconductor substrate, a number of columnar electrodes are respectively arranged on the upper surfaces of connection pad portions formed on ends of the extended wiring lines, and a sealing film is formed so as to cover the wiring lines between the columnar electrodes on the upper surface of the insulating film. The sealing film is formed so that the upper surface of the sealing film and the upper surfaces of the columnar electrodes are on one plane. Solder balls are respectively provided on the upper surfaces of the columnar electrodes.

Among such semiconductor devices as described above, there is a device in which an interlayer insulating film wiring line laminated structure portions each including a laminated structure of interlayer insulating films and the wiring lines is provided between the semiconductor substrate and the insulating film. In this device, when an interval between the wiring lines of the interlayer insulating film wiring line laminated structure portion decreases with miniaturization of the semiconductor devices, a capacity between the wiring lines increases, with the result that a delay of a signal which transmits through the wiring lines increases.

To improve this point, as a material of the interlayer insulating film, much attention is paid to a low dielectric material such as a low-k material having a dielectric constant lower than a dielectric constant of 4.2 to 4.0 of silicon oxide which is generally used as the material of the interlayer insulating film. Examples of the low-k material include SiOC obtained by doping silicon oxide ($SiO_2$) with carbon (C), and SiOCH further containing H. To further lower the dielectric constant, air-containing porous type low dielectric films are also being investigated.

In the above semiconductor device including the low dielectric film, especially the low dielectric film represented by the porous type low dielectric film having a hollow structure has a small mechanical strength and is easily influenced by moisture. As a result, there is a problem that the low dielectric film easily peels from an underlayer.

BRIEF SUMMARY OF THE INVENTION

An object of the present invention is to provide a semiconductor device capable of significantly avoiding a problem of peeling of a low dielectric film, and a method for manufacturing the same.

A semiconductor device according to one aspect of the present invention comprises a semiconductor substrate and a low dielectric film wiring line laminated structure portion which is provided on one surface of the semiconductor substrate. The low dielectric film wiring line laminated structure portion has a laminated structure including a plurality of low dielectric films and a plurality of wiring lines, each of the low dielectric films having a relative dielectric constant of 3.0 or lower and a glass transition temperature of 400° C. or higher. An insulating film is formed at least on the low dielectric film wiring line laminated structure portion. On the insulating film, there, are provided a connection pad portion for an electrode so as to be connected to a connection pad portion of an uppermost wiring line of the low dielectric film wiring line laminated structure portion, a bump electrode for external connection, provided on the connection pad portion for the electrode, and a sealing film made of an organic resin and provided at least on a part of the insulating film which surrounds the pump electrode for the external connection. Side surfaces of the low dielectric film wiring line laminated structure portion are covered with one of the insulating film and the sealing film.

A method for manufacturing a semiconductor device according to another aspect of the present invention comprises preparing a semiconductor wafer, on one surface of which a low dielectric film wiring line laminated structure portion is formed, the low dielectric film wiring line laminated structure portion including low dielectric films and wiring lines, the low dielectric films having a relative dielectric constant of 3.0 or lower and a glass transition temperature of 400° C. or higher. In the next, parts of the low dielectric film wiring line laminated structure portion in regions above dicing streets and regions on opposite sides of the dicing streets are removed by applying laser beams, thereby forming a groove exposing side surfaces of the low dielectric film wiring line laminated structure portion. Thereafter, an organic resin film covering the side surfaces of the low dielectric film wiring line laminated structure portion is formed. Then, the organic resin film and the semiconductor wafer are cut along the dicing streets, thereby obtaining a plurality of, semiconductor devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
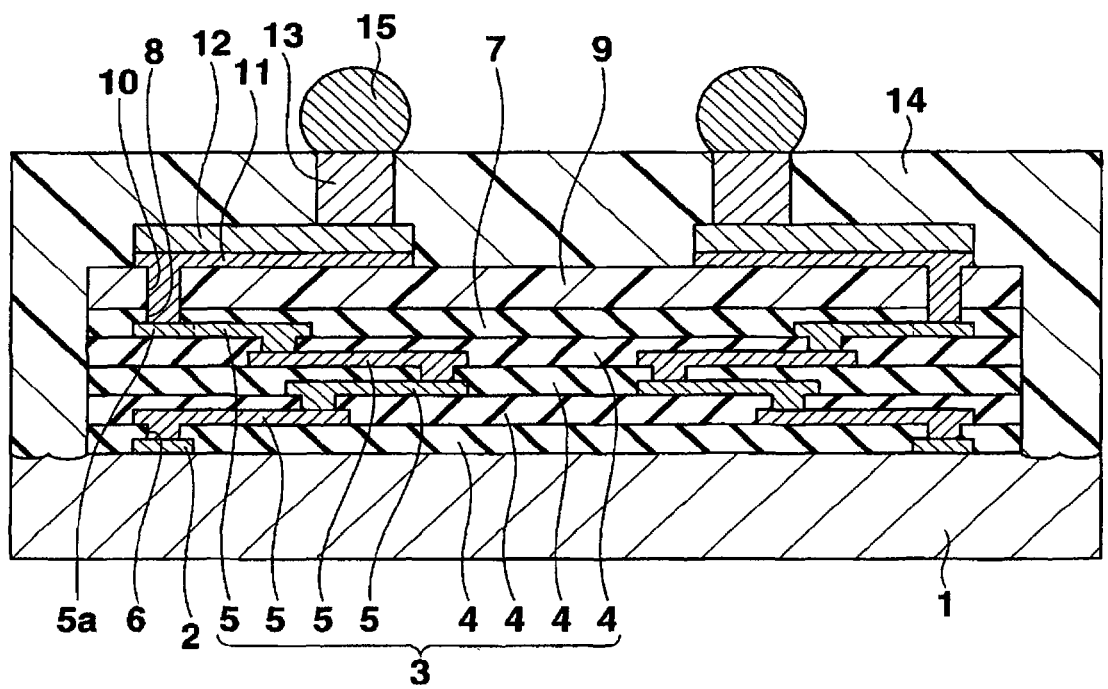
FIG. 1 is a sectional view of a semiconductor device as a first embodiment of the present invention.

FIG. 1 shows a sectional view of a semiconductor device as a first embodiment of the present invention. This semiconductor device includes a silicon substrate (a semiconductor substrate) 1. On the upper surface of the silicon substrate 1, a number of active semiconductor elements, such as transistors, are provided (not shown). In a peripheral portion of the upper surface of the substrate 1, a number of connection pads 2 made of an aluminum-based metal or the like are electrically connected to the respective semiconductor elements, although the figure shows only two pads. The connection pads 2 are input and/or output terminals of each semiconductor element, and/or a power supply terminal.

On the upper surface of the silicon substrate 1, excluding peripheral portions outside the connection pads 2, a low dielectric film/wiring line/laminated structure portion 3 is provided. The laminated structure portion 3 has a structure in which there are alternately laminated a plurality of layers, for example, four layers of low dielectric films 4 and the same number of layers of wiring lines 5 made of copper or an aluminum-based metal or the like.

Examples of a material of the low dielectric films 4 include a polysiloxane-based material having an Si—O bond and an Si—H bond (HSQ: Hydrogen silsesquioxane having a relative dielectric constant of 3.0), a polysiloxane-based material having an Si—O bond and an Si—CH$_3$ bond (MSQ: Methyl silsesquioxane having a relative dielectric constant of 2.7-2.9), carbon-doped silicon oxide (SiOC having a relative dielectric constant of 2.7-2.9) and an organic polymer-based low-k material. The materials having a relative dielectric constant of 3.0 or lower and a glass transition temperature of 400° C. or higher can be used.

Examples of the organic polymer-based low-k material include "SILK (having a relative dielectric constant of 2.6)" produced by Dow Chemical Company and "FLARE (having a relative dielectric constant of 2.8)" produced by Honeywell Electronic Materials Company. The glass transition temperature of 400° C. or higher is a condition for tolerance to a temperature in a manufacturing step or steps to be described later. A porous type of each of the above materials may also be used.

Besides the above, the material of the low dielectric films 4 may also be a material which has a relative dielectric constant higher than 3.0 in a normal condition, but can have a relative dielectric constant of 3.0 or lower and a glass transition temperature of 400° C. or higher when it becomes porous. For example, fluorinated silicate glass (FSG having a relative dielectric constant of 3.5-3.7), boron-doped silicate glass (BSG having a relative dielectric constant of 3.5) or silicon oxide (having a relative dielectric constant of 4.0-4.2) may be used.

In the low dielectric film wiring line laminated structure portion 3, the wiring lines 5 between the low dielectric films 4 are electrically connected to each other through holes formed in the films 4. One end portion of the wiring line 5 of the lowermost layer is electrically connected to the connection pad 2 via an opening 6 formed in the low dielectric film 4 of the lowermost layer. Connection pad portions 5a of the wiring lines 5 of an uppermost layer are arranged on an upper surface peripheral portion of the low dielectric film 4 of the uppermost layer.

A passivation film 7 made of an inorganic material such as silicon oxide is provided on the upper surfaces of the uppermost wiring lines 5 and the low dielectric films 4 of the uppermost layer. Openings 8 are formed through the passivation film 7 in portions corresponding to the connection pad portions 5a of the wiring lines 5 of the uppermost layer. On the upper surface of the passivation film 7, there is provided a protective film (insulating film) 9 made of an organic material containing polyimide, epoxy, phenol, bismaleimide, acryl, synthetic rubber, polybenzoxide or the like as a main component. Openings 10 are formed through the protective film 9 in portions corresponding to the openings 8 of the passivation film 7.

On the upper surface of the protective film 9, metallic underlayers 11 made of copper or the like are provided. On the whole upper surface of each of the metallic underlayers 11, an upper layer wiring line 12 made of copper is provided. End portions of the upper layer wiring line 12 and the metallic underlayers 11, are connected to the connection pad portions 5a of the wiring lines 5 of the uppermost layer via the openings 8, 10 of the passivation film 7 and the protective film 9. On the upper surfaces of connection pad portions (connecting pad portions for electrodes) of the upper layer wiring lines 12, there are provided columnar electrodes (bump electrodes for external connection) 13 made of copper.

On the upper surfaces of the upper layer wiring lines 12 and the protective film 9, and the upper surface of the peripheral portion of the silicon substrate 1, there is provided a sealing film 14 made of an organic material such as an epoxy-based resin so that the upper surface of the sealing film and the upper surfaces of the columnar electrodes 13 are on one plane. In this state, the side surfaces of the low dielectric film wiring line laminated structure portion 3, the passivation film 7 and the protective film 9 form substantially one plane and are entirely covered with the sealing film 14. Solder balls 15 are provided on the upper surfaces of the columnar electrodes 13.

As described above, in this semiconductor device, a region on the silicon substrate 1 except the peripheral portion is provided with the low dielectric film wiring line laminated structure portion or structure portions 3 each including the laminated structure of the low dielectric films 4 and the wiring lines 5, and the side surfaces of the low dielectric film wiring line laminated structure portion 3, the passivation film 7 and the protective film 9 are covered with the sealing film 14. Therefore, the low dielectric film wiring line laminated structure portion 3 does not easily peel from the silicon substrate 1.

Figure 2:
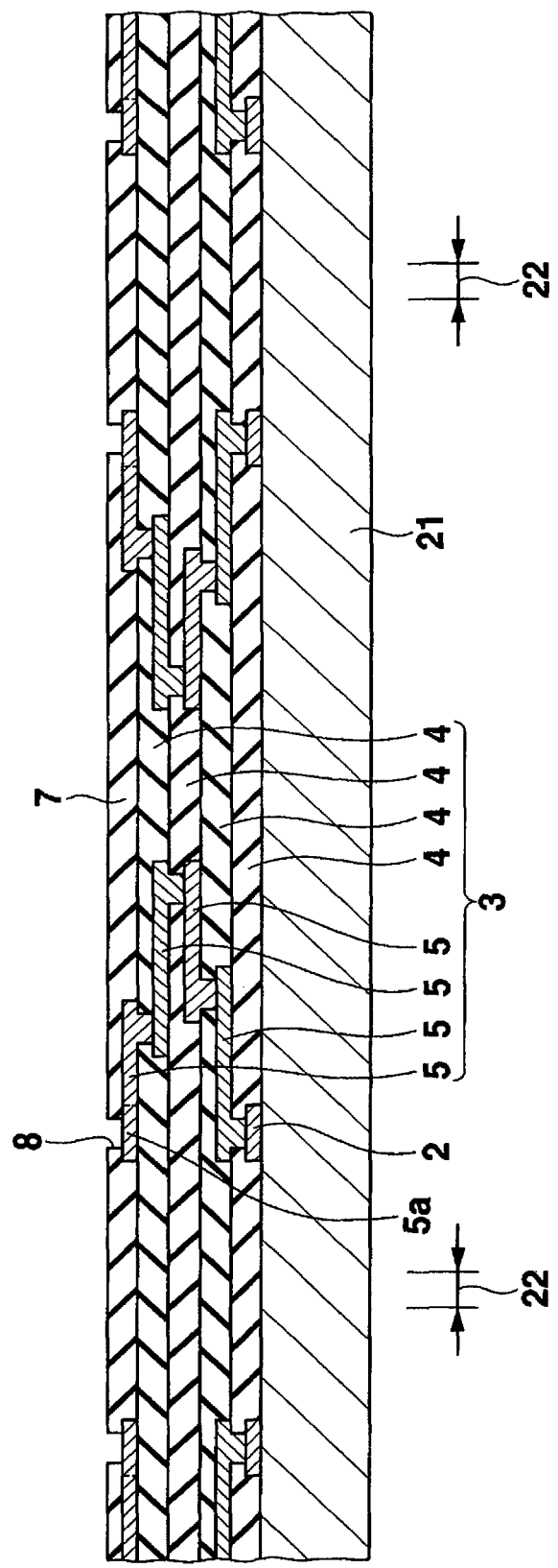
FIG. 2 is a sectional view of an assembly first prepared during manufacturing of the semiconductor device shown in FIG. 1.

Next, one example of a method for manufacturing the semiconductor device mentioned above will be described. First, as shown in FIG. 2, an assembly is prepared, in which on a silicon substrate (hereinafter referred to as a semiconductor wafer 21) of a wafer state, there are arranged the connection pads 2 and the low dielectric film wiring line laminated structure portions 3 each including four layers of low dielectric films 4 and wiring lines 5. In the assembly, the passivation film 7 is provided on the laminated structure portions 3, and the centers of the connection pad portions 5a of the wiring lines 5 of the uppermost layer are exposed via the openings 8 provided in the passivation film 7.

Examples of a low dielectric film material 4 may be those, including a porous type, as described above, which have a relative dielectric constant of 3.0 or lower and a glass transition temperature of 400° C. or higher. It is to be noted that regions denoted with reference numeral 22 in FIG. 2 are regions corresponding to dicing streets.

Figure 3:
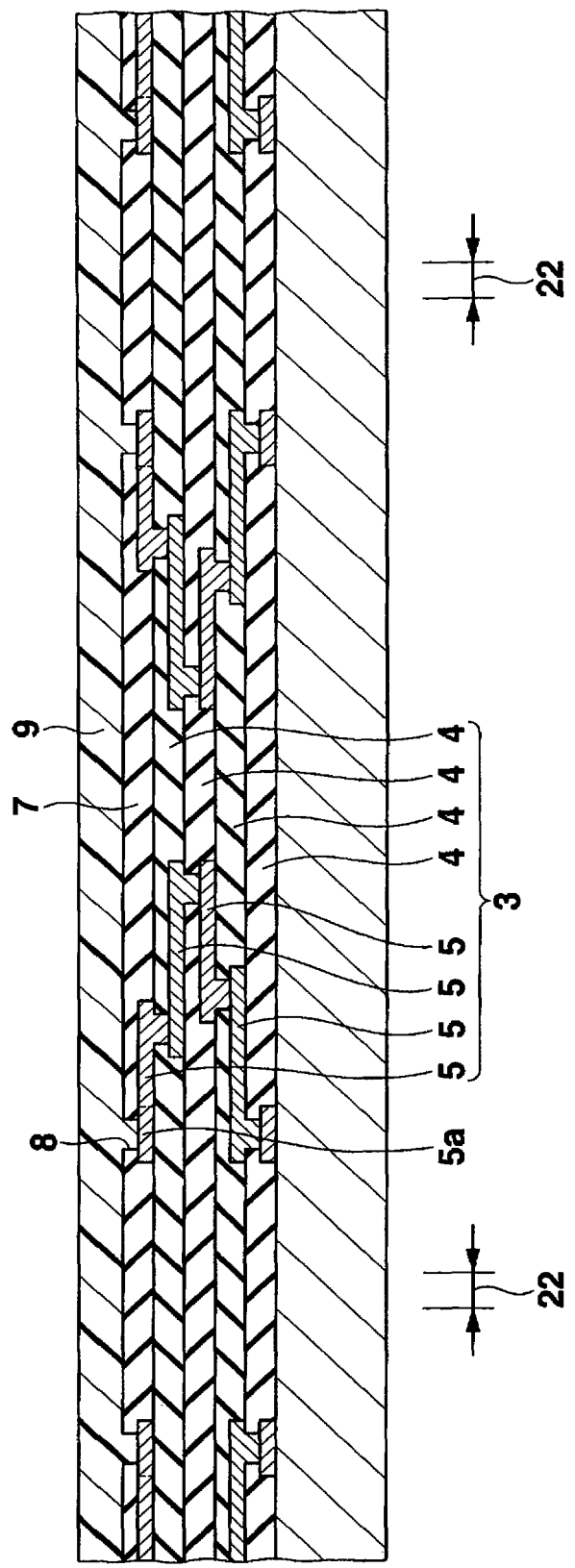
FIG. 3 is a sectional view of an assembly in a step subsequent to FIG. 2.
Figure 4:
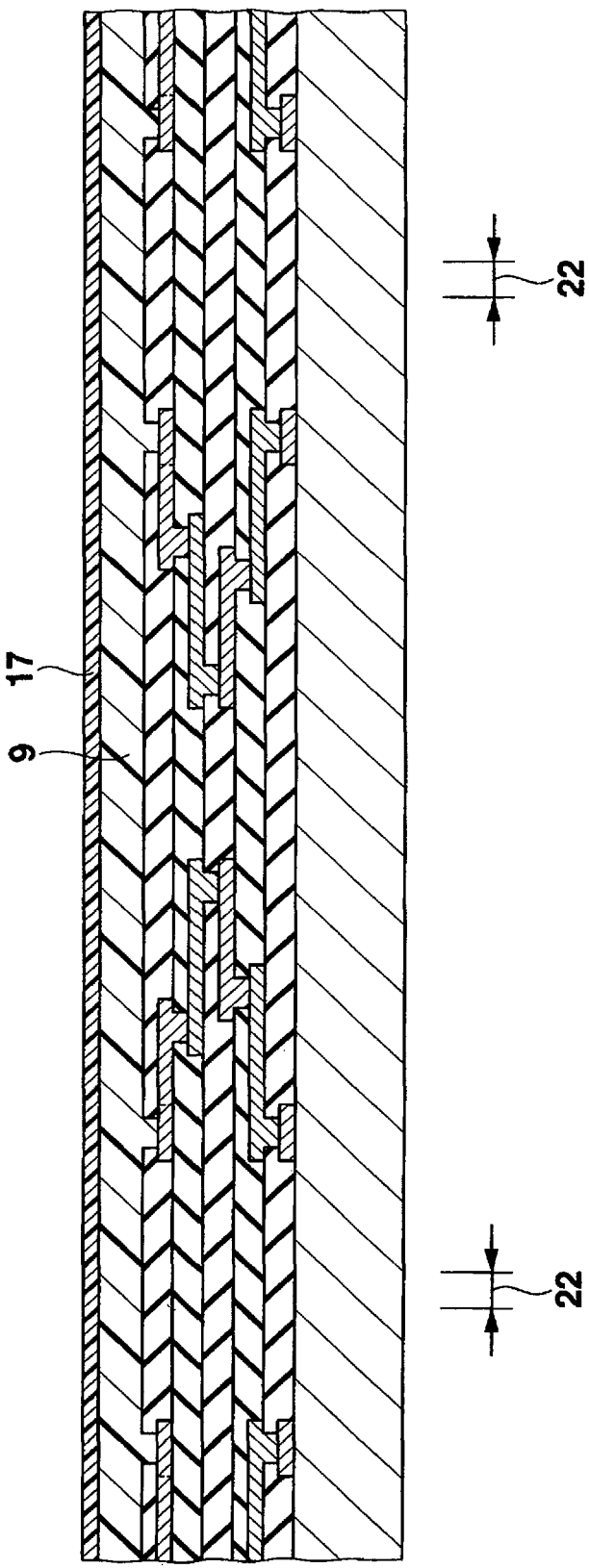
FIG. 4 is a sectional view of an assembly in a step subsequent to FIG. 3.

Next, as shown in FIG. 3, by a screen printing process, a spin coating process or the like, the protective film 9 made of an organic material such as a polyimide-based resin is formed on the upper surface of the passivation film 7 and the upper surfaces of the connection pad portions 5a of the wiring lines 5 of the uppermost layer exposed via the openings 8 of the passivation film 7. Then, as shown in FIG. 4, a water-soluble protective film 17, made of water-soluble polymers such as polyvinyl alcohol (PVA) or polyacrylam-ide (PAM), is formed on the upper surface of the protective film 9 by a screen printing process, a spin coating process or the like.

Figure 5:
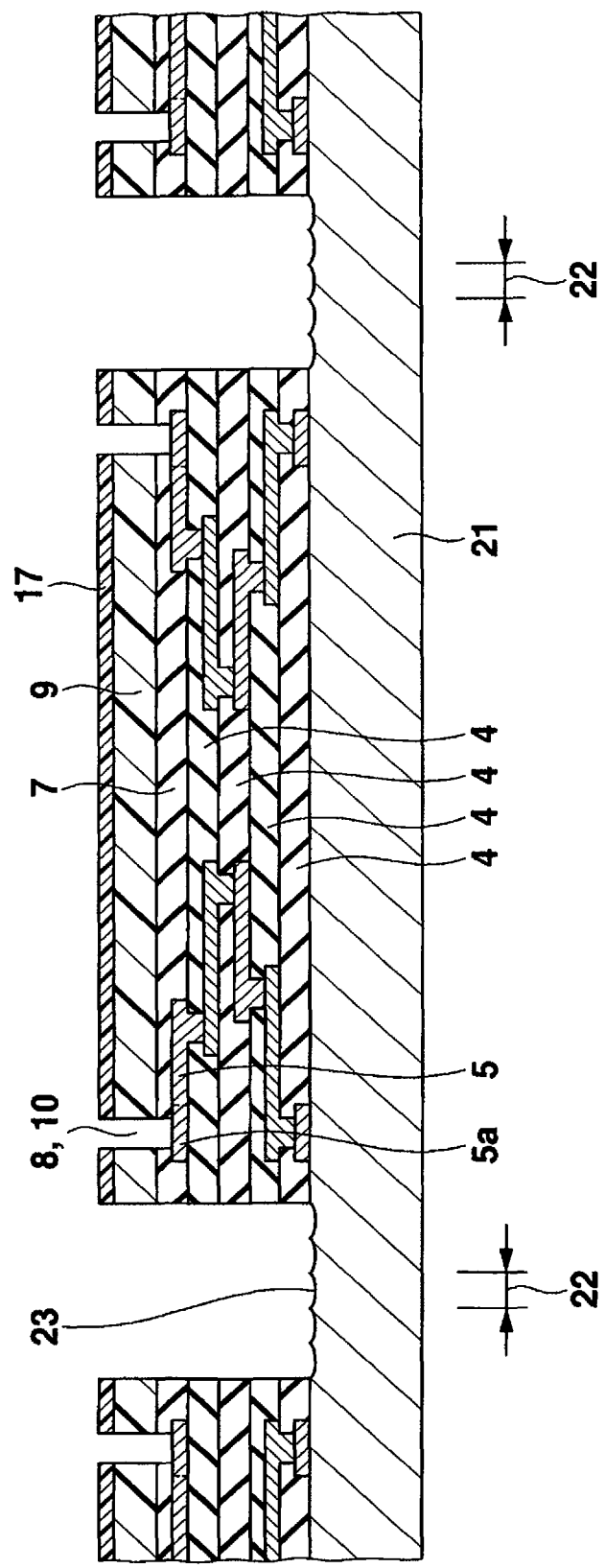
FIG. 5 is a sectional view of an assembly in a step subsequent to FIG. 4.

Next, as shown in FIG. 5, by laser processing which emits a laser beam, there are removed portions of the water soluble protective film 17, the protective film 9, the passivation film 7 and four layers of the low dielectric films 4 positioned in regions of the dicing streets 22 and regions on opposite sides of the streets to form latticed grooves 23. Further, the openings 8 and 10 are formed through the passivation film 7 and the water soluble protective film 17 in portions corresponding to the connection pad portions 5a of the wiring lines 5 of the uppermost layer.

In this process, when the laser beam is radiated on the low dielectric films 4, the low dielectric films 4 melt and scatter as low dielectric film pieces. The scattered low dielectric film pieces drop on and stick into the upper surface of the water soluble protective film 17, not the upper surface of the protective film 9. Then, when the water soluble protective film 17 is washed with water and removed, the low dielectric film pieces stuck into the upper surface of the water soluble protective film 17 are also removed simultaneously. If the scattered low dielectric film pieces are sucked by evacuation, the water soluble protective film 17 may be unnecessary.

The low dielectric films 4 are brittle. Therefore, if the grooves 23 are cut in the films 4 by using a blade, the cut surface of the low dielectric films 4 will have many notches and cracks. In view of this, it is recommended that the low dielectric films 4 be cut by the laser beam to make grooves 23. If the grooves 23 are worked by the laser beam, the upper surface of the silicon substrate 1 melts, when irradiated with the laser beam, and molten silicon particles jump and then fall onto the silicon substrate 1. Inevitably, each groove 23 will have an uneven bottom surface as shown in FIG. 5.

Figure 6:
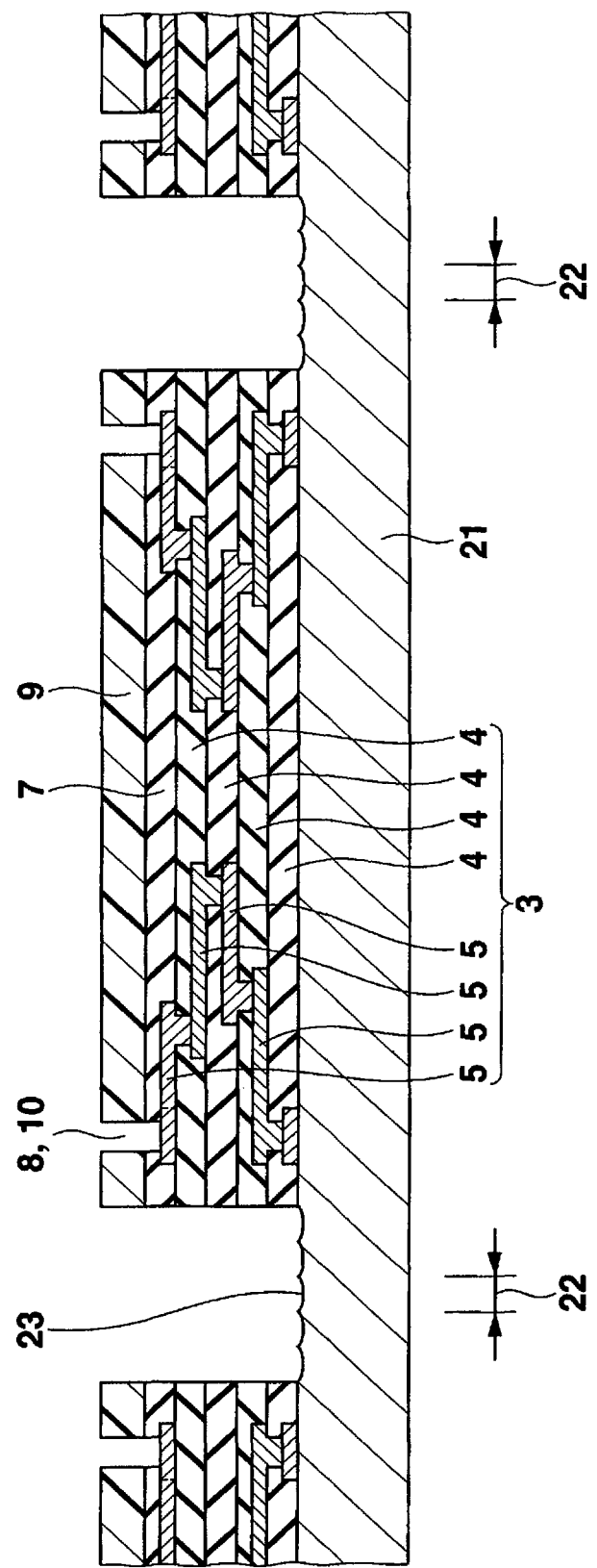
FIG. 6 is a sectional view of an assembly in a step subsequent to FIG. 5.

In this state, that is, in the state where the water soluble protective film 17 has been removed, as shown in FIG. 6, the upper surface of the semiconductor wafer 21 in the regions of the dicing streets 22 and the regions on opposite sides of the streets is exposed via the grooves 23. Moreover, portions of the four layers of the low dielectric films 4, the passivation film 7 and the protective film 9 laminated on the semiconductor wafer 21 are separated from one another by the grooves 23. In consequence, a plurality of low dielectric film wiring line laminated structure portions 3 independent of one another are formed on the wafer 21, as shown in FIG. 1.

As one example, a width of the groove 23 is 10 to 1000 μm×2 plus a width of the dicing street (a dicing cutter) 22. As a result, in the completed device shown in FIG. 1, a width of the portion of the sealing film 14 which covers the side surfaces of the low dielectric film wiring line laminated structure portion 3, the passivation film 7 and the protective film 9 is 10 to 1000 μm.

Figure 7:
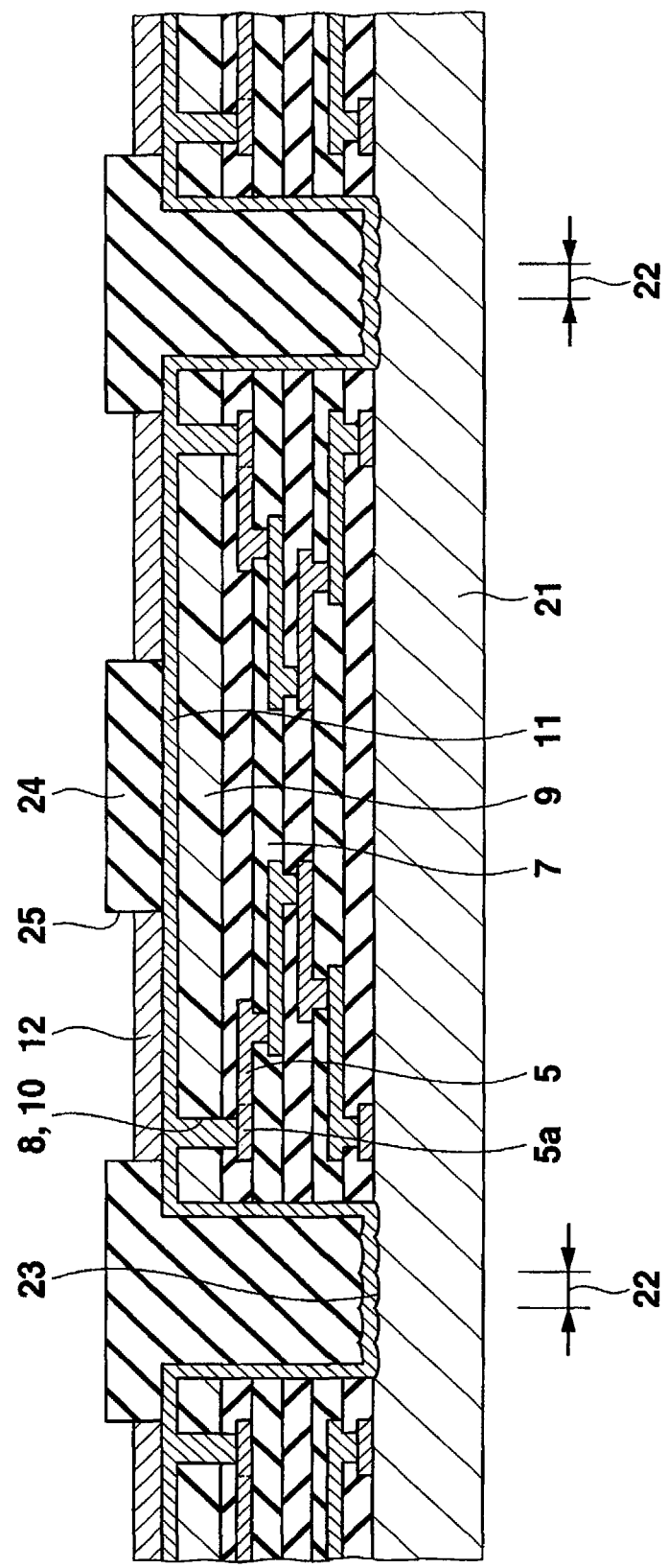
FIG. 7 is a sectional view of an assembly in a step subsequent to FIG. 6.

Next, as shown in FIG. 7, the metallic underlayers 11 are formed on the upper surfaces of the connection pad portions 5a of the wiring lines 5 of the uppermost layer exposed via the openings 8, 10 of the passivation film 7 and the protective film 9, on the portions of the upper surface of the semiconductor wafer 21 exposed via the grooves 23, and on the whole upper surface of the protective film 9. In this case, the metallic underlayers 11 may be formed by an only copper layer formed by electroless plating, an only copper layer formed by sputtering, or a copper layer formed by the sputtering on a thin film layer of titanium or the like formed by the sputtering.

Next, plating resist films 24 are formed on the upper surfaces of the metallic underlayers 11, and followed by patterning. As a result, openings 25 are formed in portions of the plating resist films 24 corresponding to regions in which the upper layer wiring lines 12 are formed. Next, electrolytic plating of copper is performed by use of the metallic underlayers 11 as plating current paths to thereby form the upper layer wiring lines 12 on the upper surfaces of the metallic underlayers 11 in the openings 25 of the plating resist films 24. Next, the plating resist films 24 are peeled.

Figure 8:
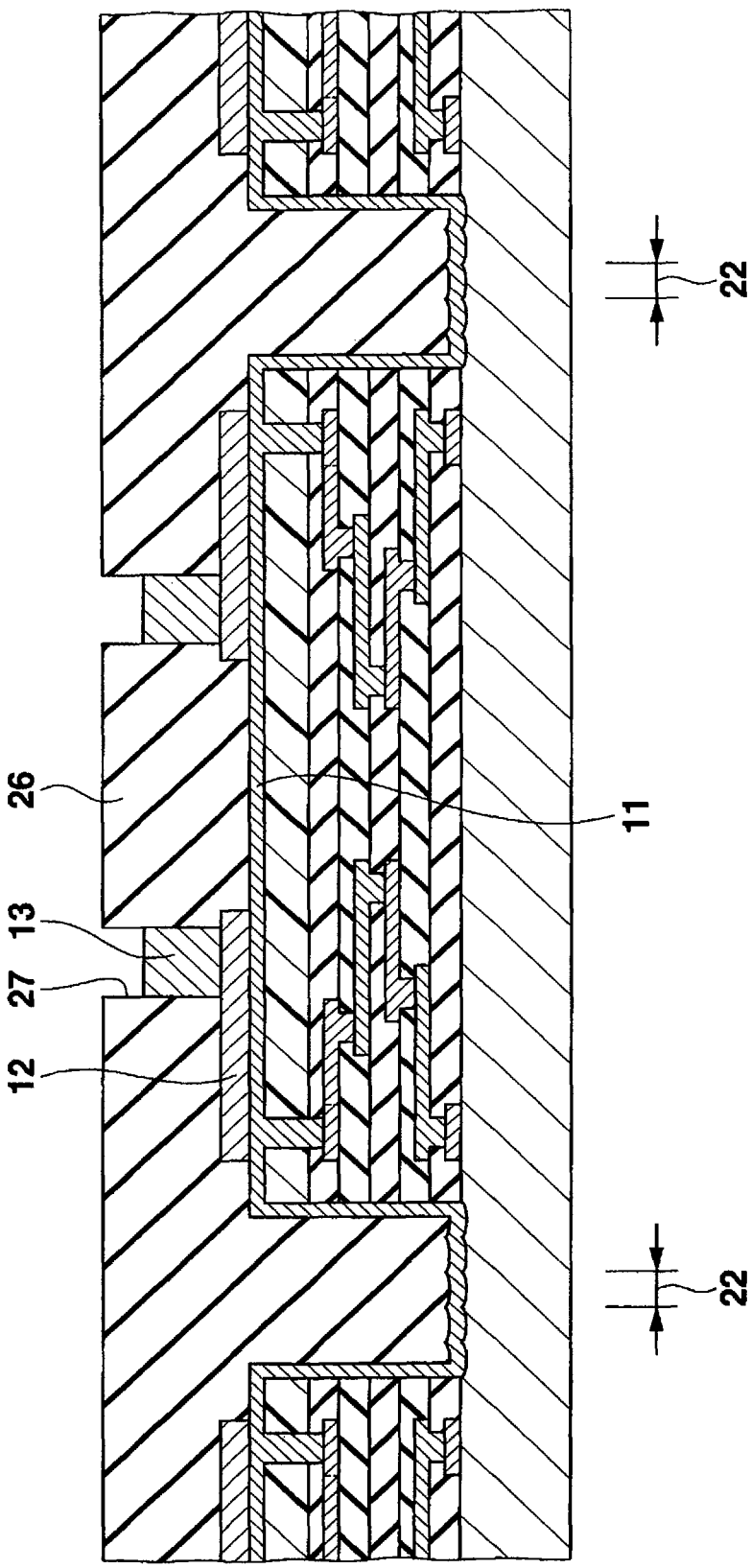
FIG. 8 is a sectional view of an assembly in a step subsequent to FIG. 7.
Figure 9:
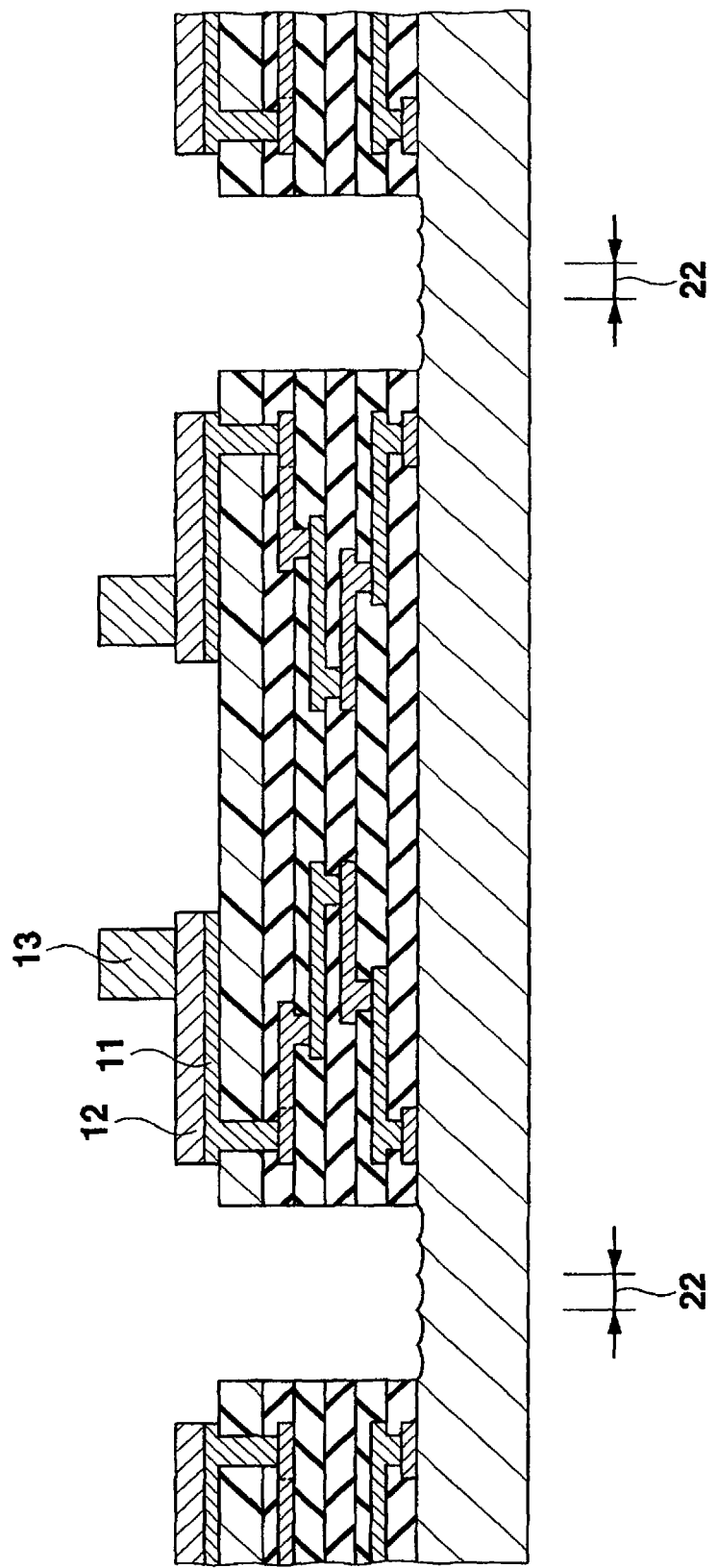
FIG. 9 is a sectional view of an assembly in a step subsequent to FIG. 8.

Next, as shown in FIG. 8, on the upper surfaces of the metallic underlayers 11 and the upper layer wiring lines 12, a plating resist film 26 is formed by depositing and then patterning. Thus, in this case, openings 27 are formed in the plating resist film 26 in portions corresponding to the connection pad portions (regions where the columnar electrodes 13 are formed) of the upper layer wiring lines 12. Next, the electrolytic plating of copper is performed by use of the metallic underlayers 11 as the plating current paths, whereby the columnar electrodes 13 each having a height of 50 to 150 μm are formed on the upper surfaces of the connection pad portions of the upper layer wiring lines 12 in the openings 27 of the plating resist film 26. Next, the plating resist film 26 is entirely peeled or removed. Then, unnecessary portions of the metallic underlayers 11 are etched and removed by use of the upper layer wiring lines 12 as masks. Consequently, as shown in FIG. 9, the metallic underlayers 11 only under the upper layer wiring lines 12 are left.

Figure 10:
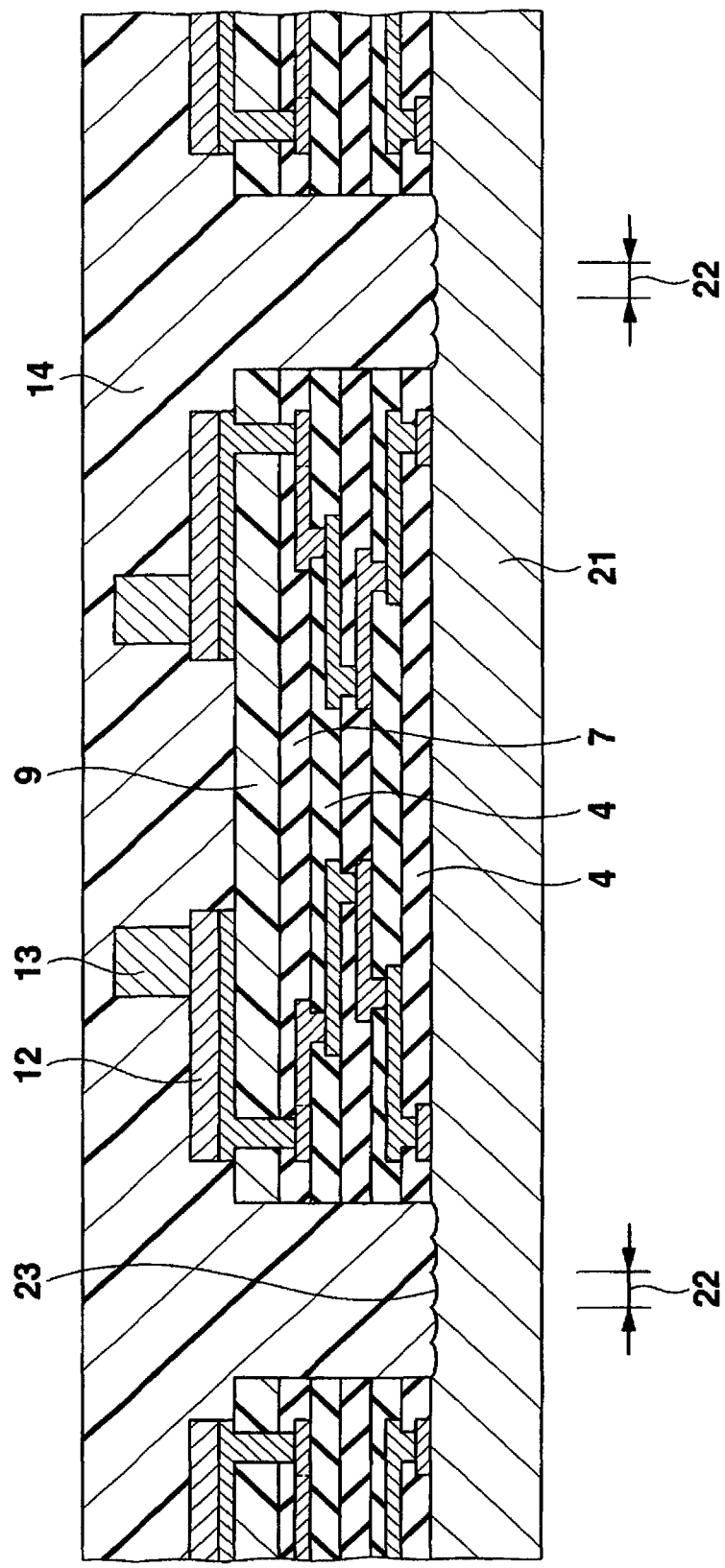
FIG. 10 is a sectional view of an assembly in a step subsequent to FIG. 9.

Next, as shown in FIG. 10, by a screen printing process, a spin coating process or the like, the sealing film (organic resin film) 14 made of an organic material such as an epoxy-based resin is entirely formed on the upper surfaces of the upper layer wiring lines 12, the columnar electrodes 13 and the protective film 9, as well as on the upper surface of the semiconductor wafer 21 exposed via the grooves 23 so that a thickness of the sealing film 14 is larger than a height of the columnar electrodes 13. Therefore, in this state, the upper surfaces of the columnar electrodes 13 are covered with the sealing film 14. The side surfaces of the protective film 9, the passivation film 7 and four layers of the low dielectric films 4 are also entirely covered with the sealing film 14.

Figure 11:
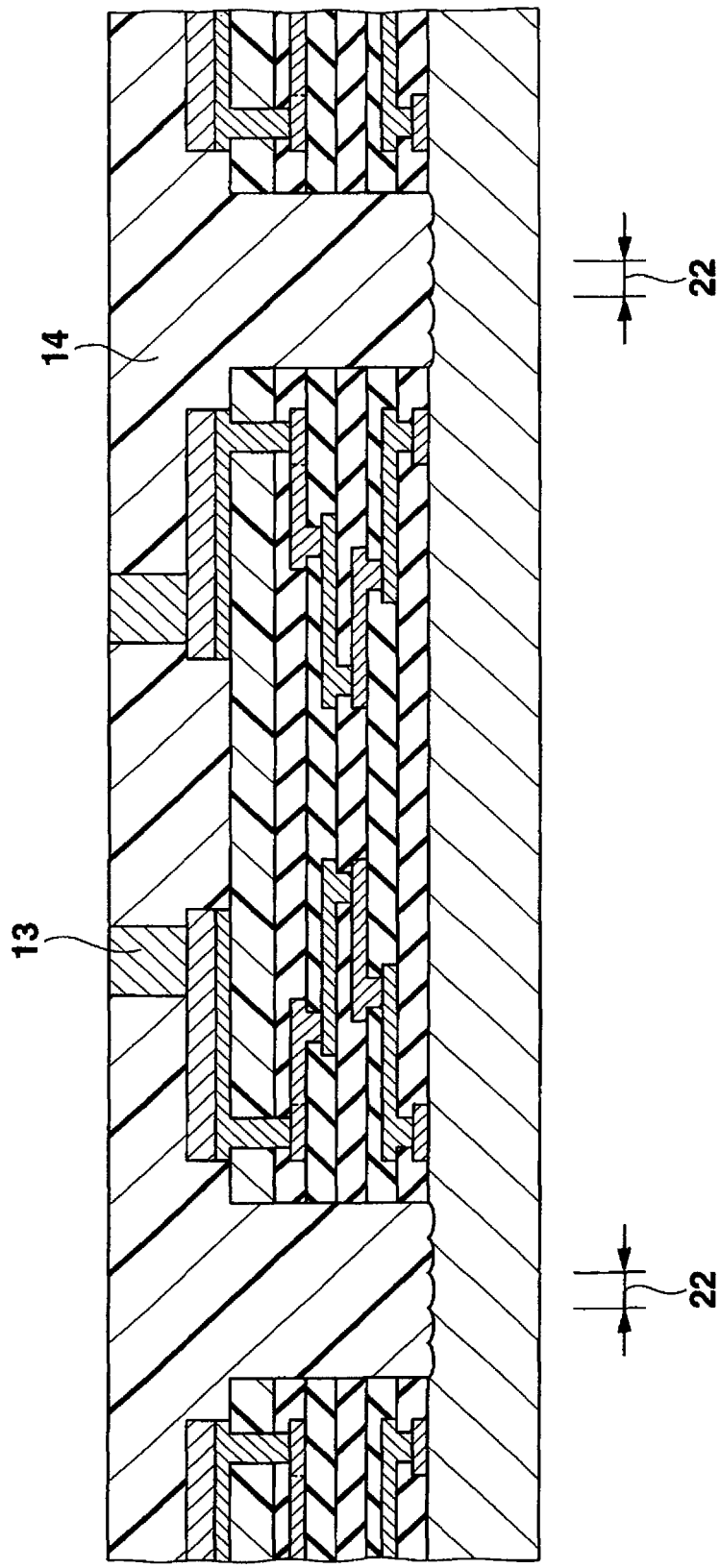
FIG. 11 is a sectional view of an assembly in a step subsequent to FIG. 10.

Next, a portion of the upper surface of the sealing film 14 is appropriately ground to expose the upper surfaces of the columnar electrodes 13 as shown in FIG. 11. Moreover, the exposed upper surfaces of the columnar electrodes 13 and the upper surface of the sealing film 14 are flattened so that these upper surfaces are on one plane. In flattening this upper surface of the sealing film 14, upper surface portions of the columnar electrodes 13 may be ground together with the upper portion of the sealing film 14 as much as several to ten or more micrometers.

Figure 12:
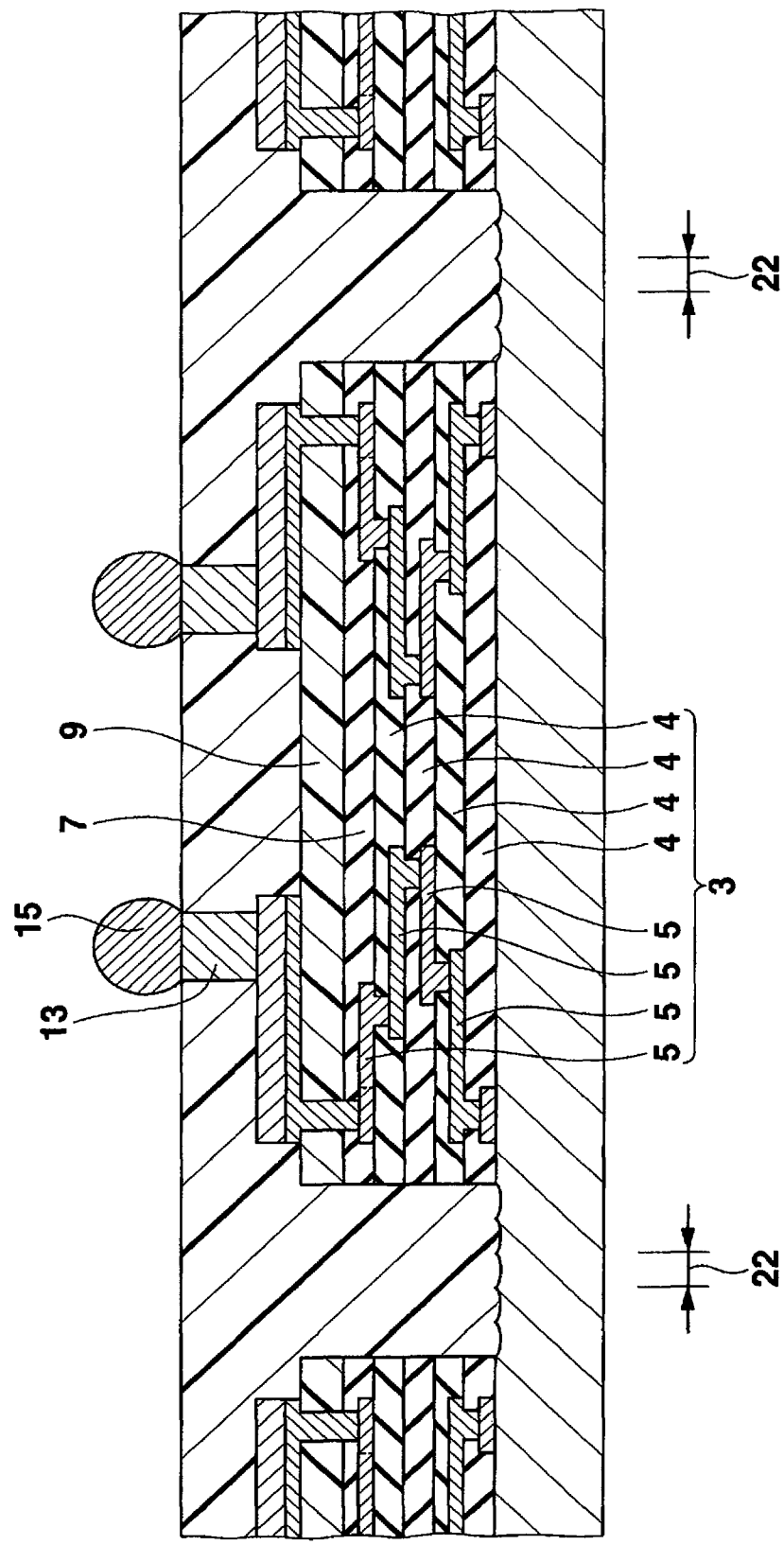
FIG. 12 is a sectional view of an assembly in a step subsequent to FIG. 11.
Figure 13:
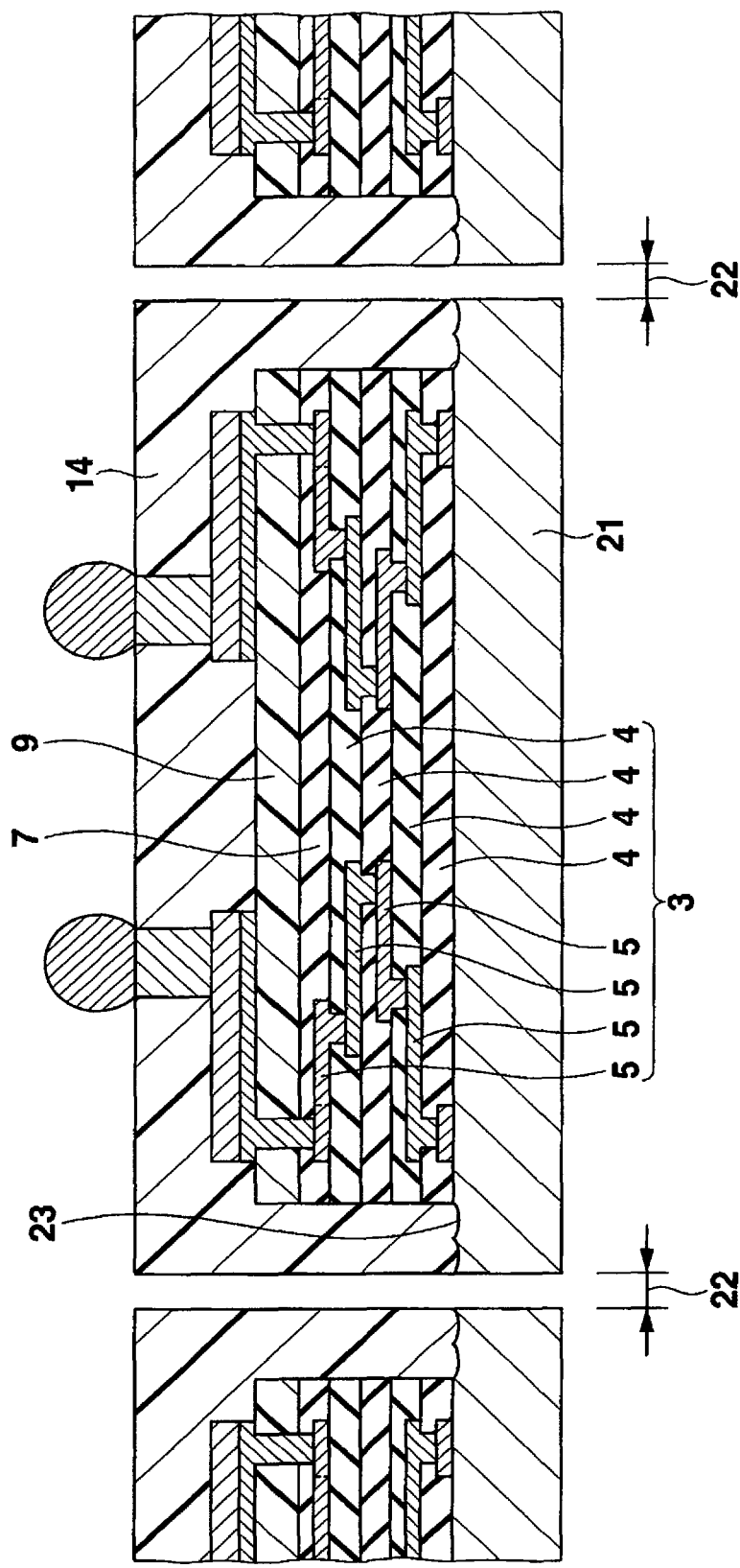
FIG. 13 is a sectional view of an assembly in a step subsequent to FIG. 12.

Next, as shown in FIG. 12, the solder balls 15 are formed on the upper surfaces of the columnar electrodes 13. Next, as shown in FIG. 13, the sealing film 14 and the semiconductor wafer 21 are cut along the dicing streets 22 in the centers of the grooves 23. As described above, since the grooves 23 have been formed to be wider than the dicing streets 22, there are obtained a plurality of semiconductor devices each having a structure in which, as shown in FIG. 1, the side surfaces of the low dielectric film wiring line laminated structure portion 3 are covered with the sealing film 14, and further the side surfaces of the passivation film 7 and the upper surface and side surfaces of the protective film 9 are also covered with the sealing film 14.

In the above embodiment, the exposed part of the upper surface of the semiconductor wafer 21 is shown like a bottom portion of the groove 23, but the upper surface of the semiconductor wafer 21 may be partially removed by a laser beam to form the groove 23, so that the bottom portion of the groove 23 may be below the upper surface of the semiconductor wafer 21. If an insulating film such as a field oxide film is formed on the upper surface of the semiconductor wafer 21, the upper surface of this field oxide film or an intermediate portion of a film thickness thereof may be the bottom portion of the groove 23, and the bottom portion of the groove 23 may be positioned above the upper surface of the semiconductor wafer 21.

(Second Embodiment)

Figure 14:
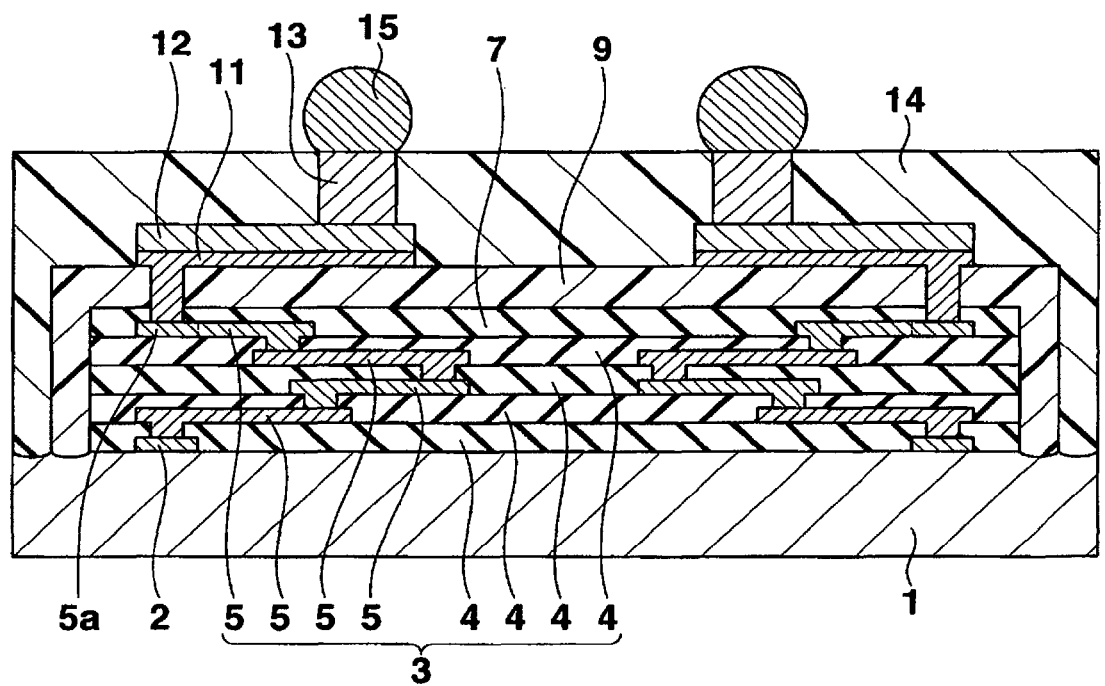
FIG. 14 is a sectional view of a semiconductor device as a second embodiment of the present invention.

FIG. 14 shows a sectional view of a semiconductor device as a second embodiment of the present invention. This semiconductor device is different from the semiconductor device shown in FIG. 1 in that the upper surface and the side surfaces of the passivation film 7 and the side surfaces of the low dielectric film wiring line laminated structure portion 3 are covered with the protective film 9, and the side surfaces of the protective film 9 is covered with the sealing film 14.

Figure 15:
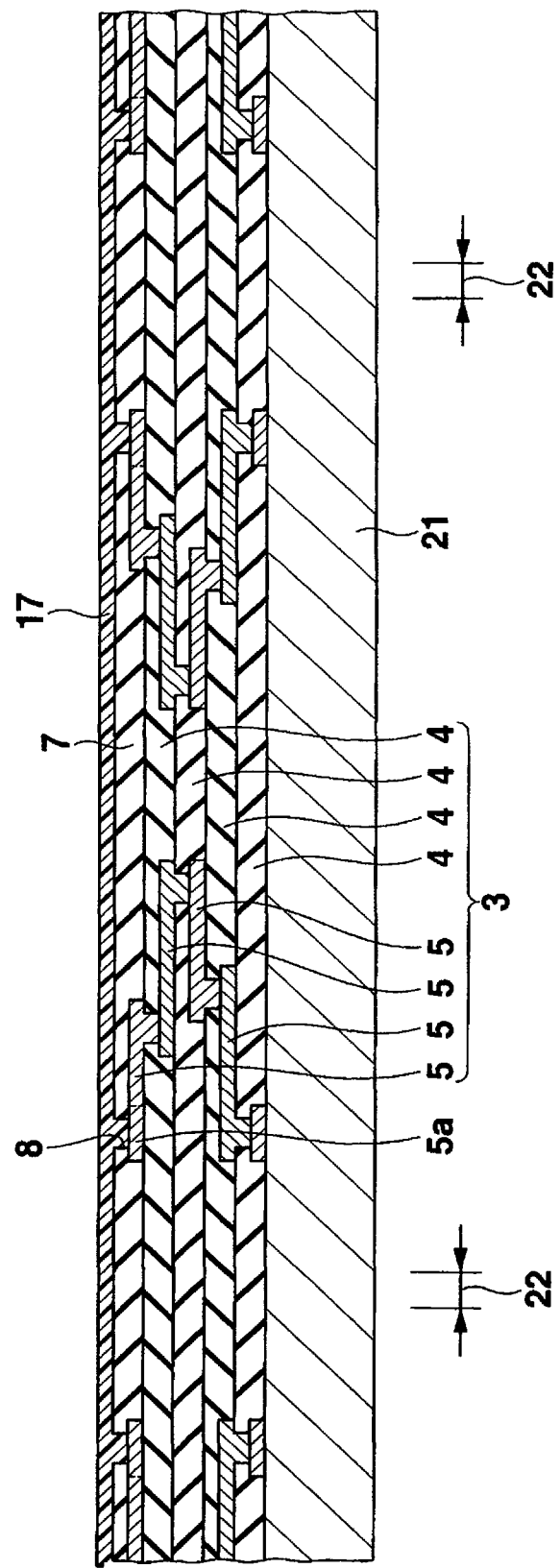
FIG. 15 is a sectional view of an assembly in a predetermined step during manufacturing of the semiconductor device shown in FIG. 14.

As one example of manufacturing this semiconductor device, an assembly shown in FIG. 2 is prepared. Then, as shown in FIG. 15, the water-soluble protective film 17, made of water-soluble polymers such as polyvinyl alcohol (PVA) or polyacrylamide (PAM), is formed on the upper surface of the passivation film 7 and the connecting pad portions 5a of the wiring lines 5 of the uppermost layer, which are exposed via the opening 8 of the passivation film 7, by a screen printing process, a spin coating process or the like.

Figure 16:
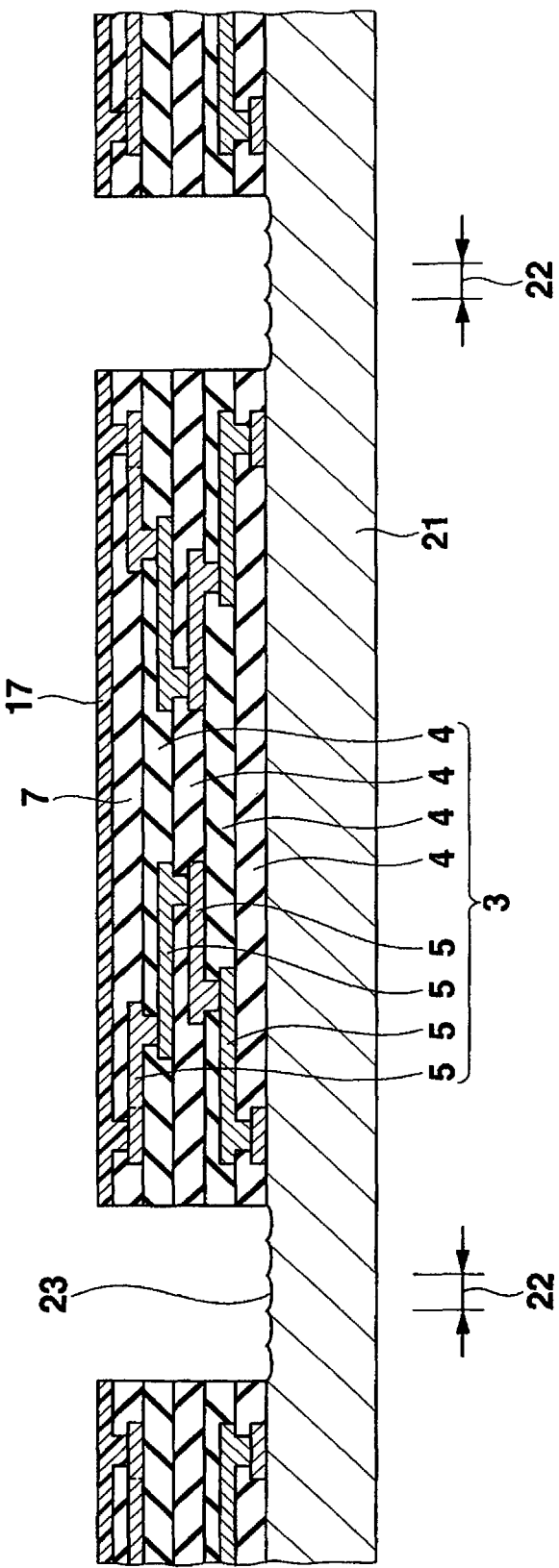
FIG. 16 is a sectional view of an assembly in a step subsequent to FIG. 15.

Thereafter, as shown in FIG. 16, by laser processing which emits a laser beam, the grooves 23 are formed in the water soluble protective film 17, the passivation film 7 and four layers of the low dielectric films 4 in regions of the dicing streets 22 and regions on opposite sides of the streets. In this process also, when the laser beam is radiated on the low dielectric films 4, the low dielectric films 4 melt and scatter as low dielectric film pieces. The scattered low dielectric film pieces drop on and stick into the upper surface of the water soluble protective film 17, not the upper surface of the passivation film 7. Then, when the water soluble protective film 17 is washed with water and removed, the low dielectric film pieces stuck into the upper surface of the water soluble protective film 17 are also removed simultaneously. In this case also, if the scattered low dielectric film pieces are sucked by evacuation, the water soluble protective film 17 may be unnecessary.

Figure 17:
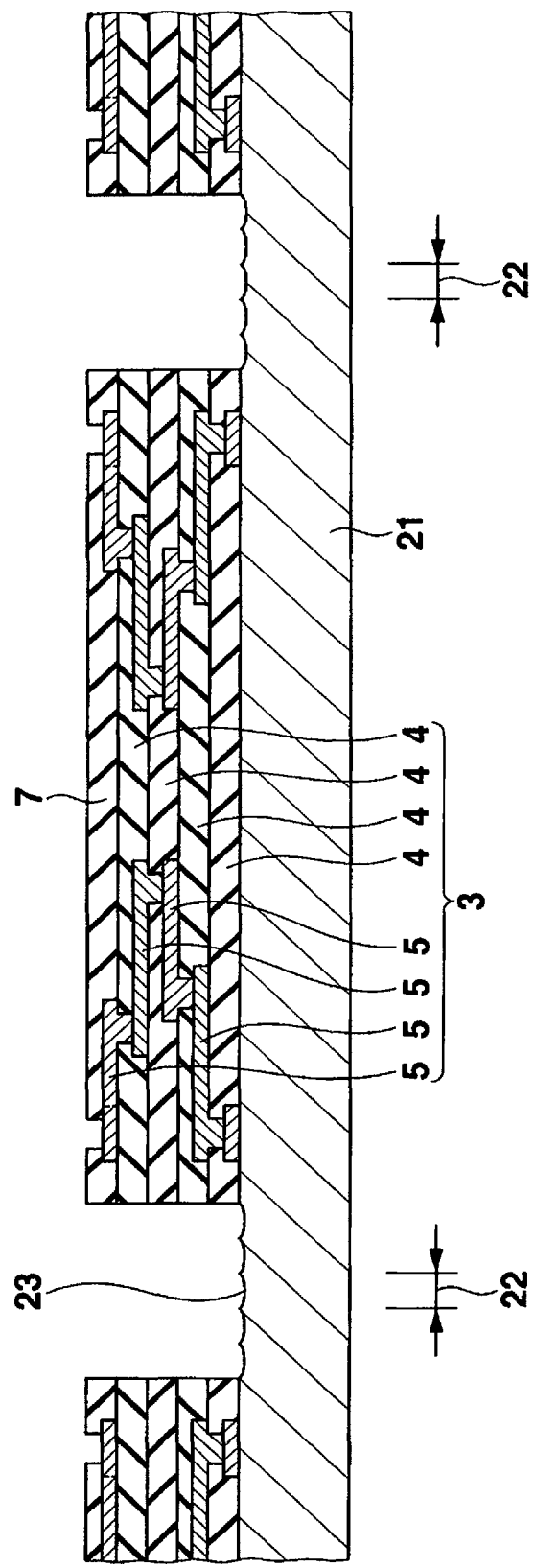
FIG. 17 is a sectional view of an assembly in a step subsequent to FIG. 16.

In this state, that is, in the state where the water soluble protective film is removed as shown in FIG. 17, the upper surfaces of the semiconductor wafer 21 in the dicing streets 22 and the regions on opposite sides of the streets are exposed via the grooves 23. Moreover, units which are laminated on the semiconductor wafer 21 and which are each constituted of four layers of the low dielectric films 4 and the passivation film 7 are separated from one another along the grooves 23. In consequence, a plurality of low dielectric film wiring line laminated structure portions 3 shown in FIG. 14 are formed on the semiconductor wafer 21.

Figure 18:
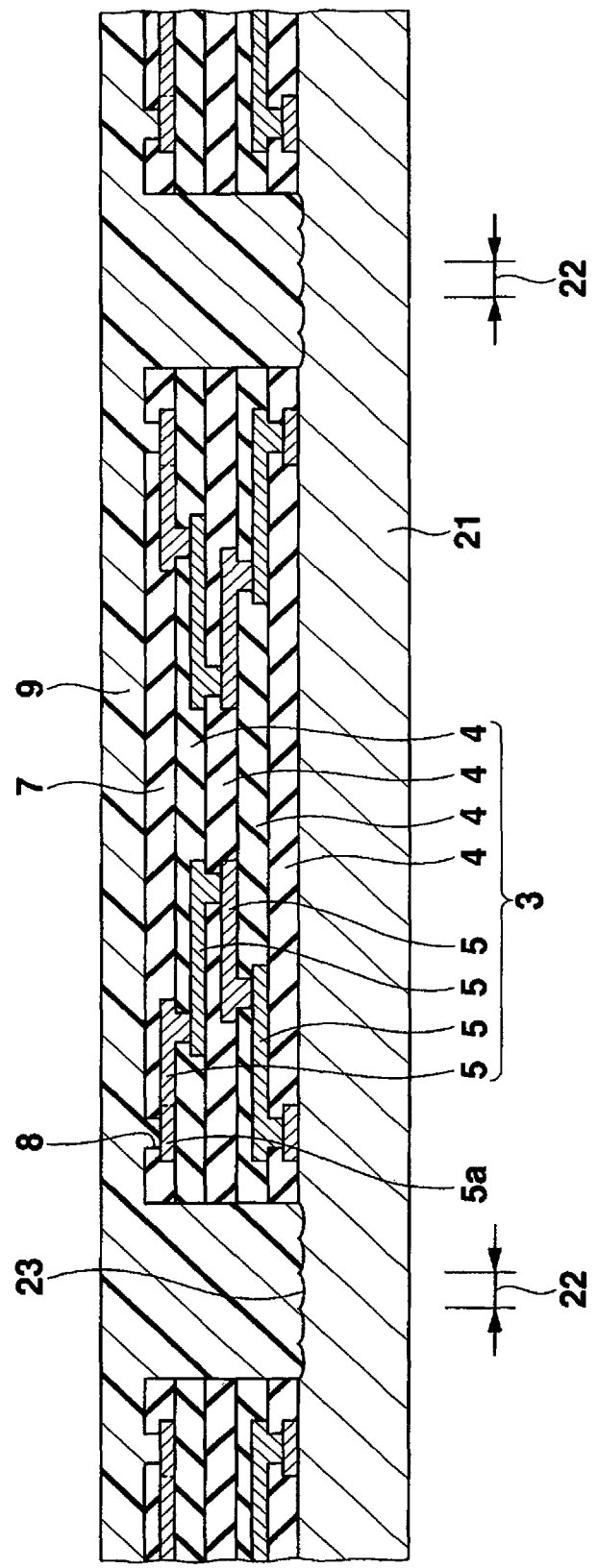
FIG. 18 is a sectional view of an assembly in a step subsequent to FIG. 17.

Next, as shown in FIG. 18, by a screen printing process, a spin coating process or the like, the protective film (organic resin film) 9 made of an organic material such as a polyimide-based resin is formed on the upper surfaces of the connection pad portions 5a of the wiring lines 5 of the uppermost layer exposed via the openings 8 of the passivation film 7, on the upper surface of the passivation film 7, and on the upper surfaces of portions of the semiconductor wafer 21 exposed via the grooves 23. It is preferable that the upper surface of the passivation film 7 and the protective film 9 formed in the grooves 23 have substantially flat surfaces.

Figure 19:
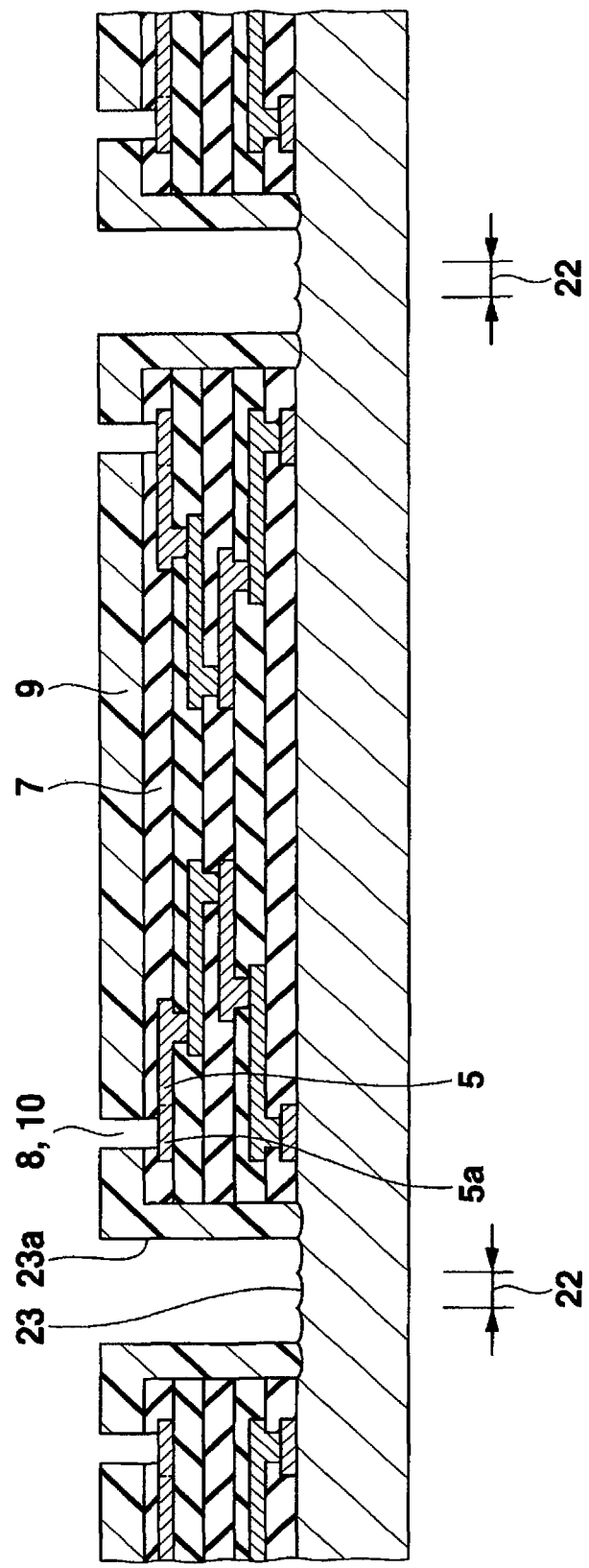
FIG. 19 is a sectional view of an assembly in a step subsequent to FIG. 18.

Next, as shown in FIG. 19, by laser processing which emits a laser beam or photolithography, grooves 23a slightly narrower than the aforementioned grooves 23 are formed in the protective film 9 in the regions of the dicing streets 22 and the regions on opposite sides of the streets, and openings 8 and 10 are formed in portions of the passivation film 7 and the protective film 9 corresponding to the connecting pad portions 5a of the wiring lines 5 in the uppermost layer. Since the subsequent steps are similar to the steps of FIG. 7 et seq. of the first embodiment, description thereof is omitted.

(Third Embodiment)

Figure 20:
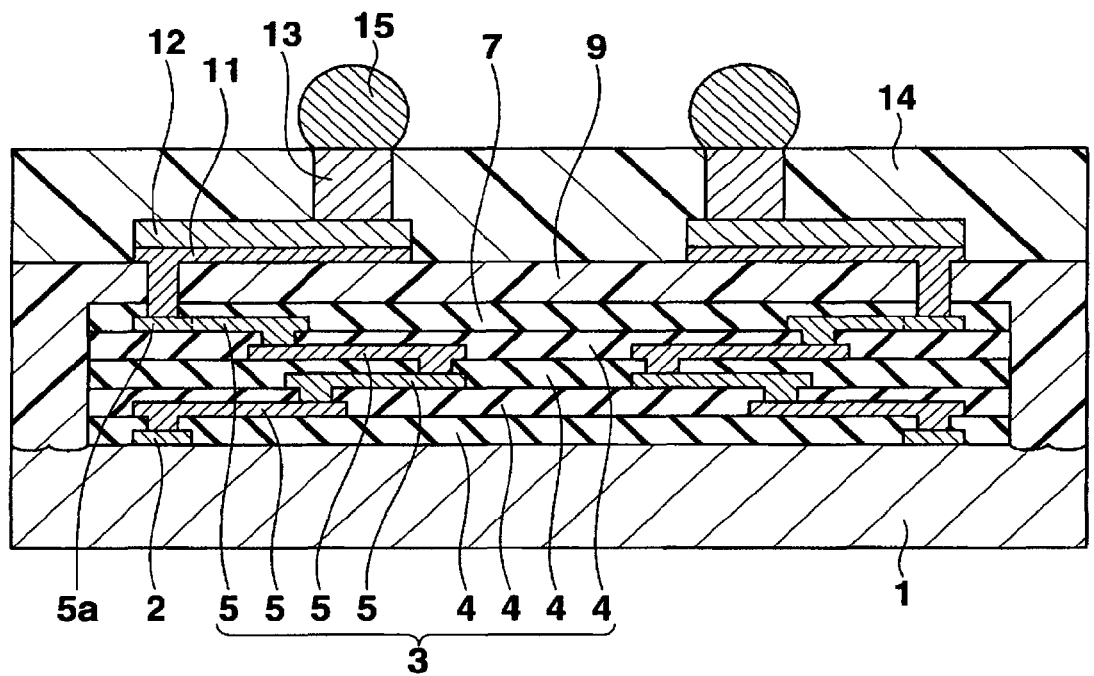
FIG. 20 is a sectional view of a semiconductor device as a third embodiment of the present invention.

FIG. 20 shows a sectional view of a semiconductor device as a third embodiment of the present invention. The third embodiment is different from the semiconductor device shown in FIG. 14 in that the protective film (organic resin film) 9 which covers the upper surface and the side surfaces of the passivation film 7 and the side surfaces of the low dielectric film wiring line laminated structure portions 3 is extended to the same plane as that of the side surface of the silicon substrate 1.

To produce the above semiconductor device, the groove 23 is completely filled with a part of the protective film 9, as shown in FIG. 18, so that the groove 23a as shown in FIG. 19 may not be formed. In this case, therefore, the sealing film 14, the protective film 9 and the semiconductor wafer 21 are cut along the dicing streets 22 in the last step.

(Fourth Embodiment)

Figure 21:
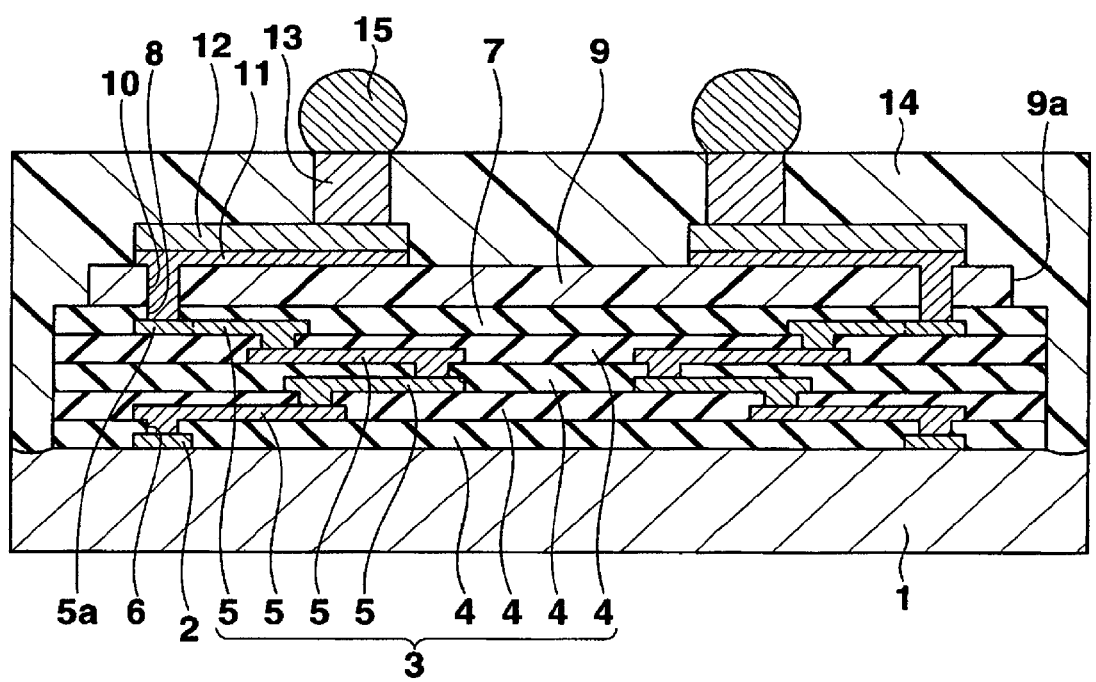
FIG. 21 is a sectional view of a semiconductor device according to a fourth embodiment of the present invention.

FIG. 21 is a sectional view of a semiconductor device according to a fourth embodiment of this invention. This semiconductor device is different from the semiconductor device shown in FIG. 1 in that the outer side surfaces 9a of the protective film 9 are located inward from the outer side surfaces of the low dielectric film wiring line laminated structure portion 3 and the passivation film 7. In other words, the protective, film 9 is formed on the passivation film 7 to be smaller than the passivation film 7 in a plane size. In this case, each of the outer side surfaces of the passivation film 7 and each of the low dielectric film wiring line laminated structure portion 3 substantially form one plane (vertical plane in FIG. 21).

An example of the method for manufacturing the semiconductor device will be described. For example, as shown in FIG. 3, the protective film (organic resin film) 9 is formed on the entire surface of the passivation film 7. Then, the protective film 9 is patterned by means of photolithography, thereby forming the protective film as shown in FIG. 21. The patterning of the protective film 9 is carried out such that a side surface 9a may not reach the dicing line 22. The side surface 9a of the protective film 9 is deviated from the side surfaces of the passivation film 7 and the low dielectric film wiring line limited structure portion 3 by a distance greater than a positioning deviation that may occur in the next step of laser radiation. Thereafter, the water soluble protective film may be formed on the entire surface, if necessary, and laser beams are applied to the passivation film 7 and the low dielectric film wiring line laminated structure portion 3, making' grooves 23.

Another example of the method for manufacturing the semiconductor device will be described. In this example, as shown in FIG. 17, before the protective film 9 is formed, the laser beams are applied to the passivation film 7 and the low dielectric film 4, thereby forming the grooves 23. Then, as shown in FIG. 18, after the laser beams are applied to form the grooves 23, the protective film 9 is patterned. Next, the protective film 9 is formed on the entire surface of the passivation film 7 including the insides of the grooves 23 by spin coating or the like. Then, the protective film 9 is patterned by means of photolithography so as to remove those parts of the protective film 9 in the grooves 23 and peripheries of the passivation film 23, thereby forming the protective film as shown in FIG. 21.

In both the above examples of the method for manufacturing the semiconductor device, the passivation film 7 and the low dielectric film 4 are processed with the laser beams, and the protective film 9 is not. Therefore, this method is particularly effective in the case where the protective film 9 is made of a material, such as a polyimide-based resin, which easily absorbs laser energy and cannot be easily cut by radiation of laser beams.

(Fifth Embodiment)

Figure 22:
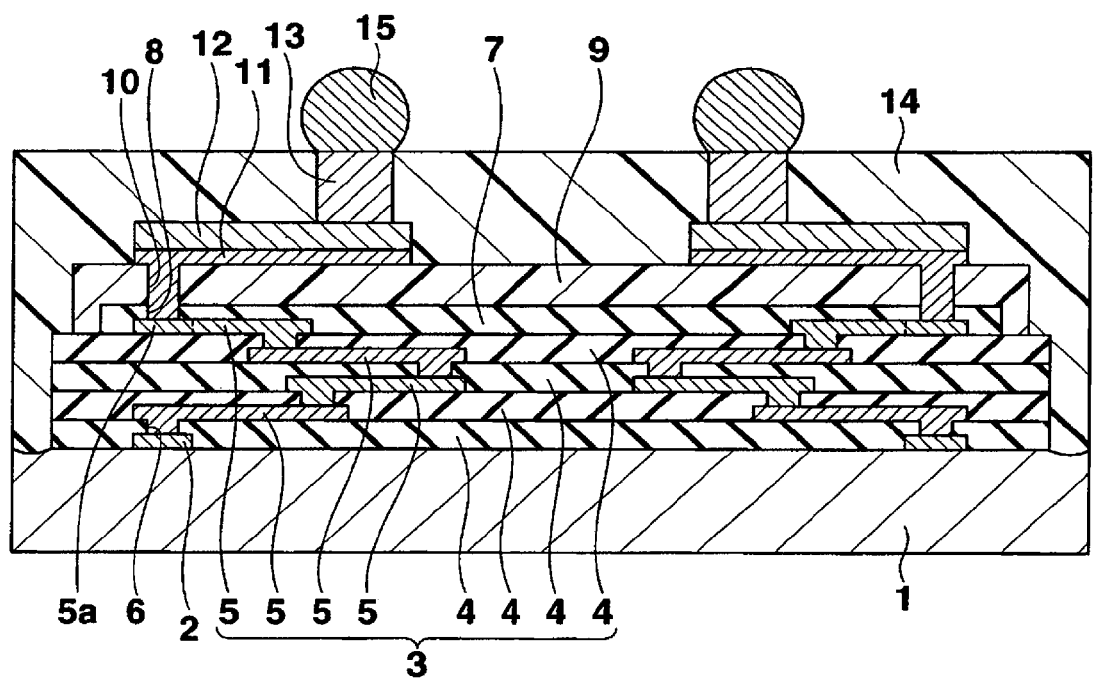
FIG. 22 is a sectional view of a semiconductor device according to a fifth embodiment of the present invention.

FIG. 22 is a sectional view of a semiconductor device according to a fifth embodiment of the present invention. This semiconductor device is different from the semiconductor device shown in FIG. 21 in that the outer side surfaces of the passivation film 7 are located inward from those of the protective film 9. In other words, the passivation film 7 is formed on the low dielectric film wiring line laminated structure portion 3 to be smaller than the protective film 9 in a plane size, and the protective film 9 has side portions downwardly extending to cover the side surfaces of the passivation film 7.

To manufacture this semiconductor device, the passivation film 7 is formed on the overall surface of the low dielectric film 4 of the uppermost layer, as shown in FIG. 2. Then, the passivation film 7 is patterned by means of photolithography. Thereafter, the protective film 9 is formed on the passivation film 7 and parts of the low dielectric film 4 of the uppermost layer which are not covered by the passivation film 7. Thereafter, the protective film 9 is patterned by means of photolithography. Then, if necessary, the water soluble protective film may be formed on the entire surface, and the low dielectric film 4 is processed by radiation of laser beams, thereby forming grooves 23.

In the above method for manufacturing the semiconductor device, only the low dielectric film 4 is processed with laser beams, and the passivation film 7 and the protective film 9 are not. Optimal laser-beam process conditions can therefore be set for the processing of the low dielectric film 4. Hence, the low dielectric film 4 can be processed efficiently with high precision. It is to be noted that the passivation film 7 may be of the same size as the protective film 9, so that the side surfaces of the passivation film 7 and the side surfaces of the protective film 9 form substantially the same plane.

(Sixth Embodiment)

Figure 23:
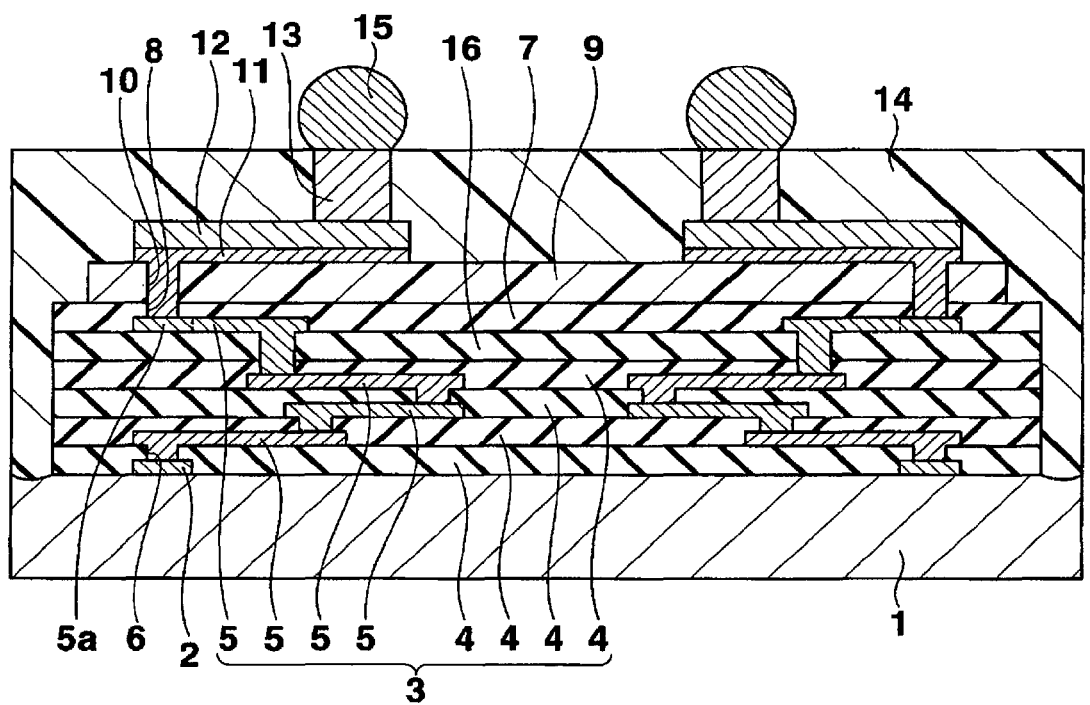
FIG. 23 is a sectional view of a semiconductor device according to a sixth embodiment of the present invention.

FIG. 23 is a sectional view of a semiconductor device according to a sixth embodiment of the present invention. This semiconductor device is different from the semiconductor device shown in FIG. 21 in that the low dielectric film wiring line laminated structure portion 3 has a lower passivation film 16 between the uppermost wiring line 5 and the uppermost low dielectric film 4.

In this case, the upper passivation film 7 and the lower passivation film 16 may be formed of the same inorganic material, such as silicon oxide. Alternatively, the passivation film 7 may be formed of silicon nitride, while the lower passivation film 16 may be formed of silicon oxide.

(Other Embodiments)

For example, in the first embodiment, after the process shown in FIG. 3, the metallic underlayers 11 may be formed on the entire upper surface of the protective film 9. Then, the upper wiring lines 12 and the columnar electrodes 13 may be formed by electrolytic plating. Then, unnecessary portions of the metallic underlayers 11 may be etched and removed by use of the upper layer wiring lines 12 as masks. Thereafter, the water soluble protective film may be formed on the entire surface, if necessary, and laser beams are applied to the protective film 9, the passivation film 7 and the low dielectric film 4, making grooves 23. In this case, if the water soluble protective film is removed after forming the grooves 23, the structure as shown in FIG. 9 can be obtained.

Referring to FIG. 21, for example, the uppermost low dielectric film 4 of the low dielectric film wiring line limited structure portion 3 may be a lower passivation film. In other words, the low dielectric film wiring line limited structure portion 3 may have a lower passivation film formed between the uppermost wiring line 5 and the second uppermost wiring line 5.

In this case, the passivation film 7 and the lower passivation film may be formed of the same inorganic material, such as silicon oxide. Alternatively, the passivation film 7 may be formed of silicon nitride, while the lower passivation film may be formed of silicon oxide.

In the above embodiments, the upper wiring lines 12 are formed on the protective film 9 and the columnar electrodes 13 are formed on the connection pad portion on the upper wiring lines 12. However, this invention is applicable to a structure in which only the connection pad portion is formed on the protective film 9 and bump electrodes for external connection, such as solder balls 15, are formed on the connection pad portion.

As described above, according to the present invention, the low dielectric film wiring line laminated structure portion having a laminated structure of the low dielectric films, which has a relative dielectric constant of 3.0 or lower and a glass transition temperature of 400° C. or higher, and the wiring lines are provided in regions excluding the peripheral portions of the semiconductor substrate. The side surfaces of the low dielectric film wiring line laminated structure portion are covered by one of the insulating film formed of organic resin or the sealing film. Therefore, the problem of peeling of the low dielectric films can be significantly avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate including an upper surface and a plurality of active semiconductor elements;
   a low dielectric film wiring line laminated structure portion which is provided on the upper surface of the semiconductor substrate, and which has a laminated structure including a plurality of low dielectric films and a plurality of wiring lines, each of the low dielectric films having a relative dielectric constant of 3.0 or lower, and at least one of said plurality of low dielectric films including a porous type film;
   a passivation film made of an inorganic material and formed on an upper surface of the low dielectric film wiring line laminated structure portion; and
   an organic resin layer including an upper portion which directly contacts with and covers an upper surface of , and a side peripheral portion which directly contacts with and covers a side peripheral surface of the low dielectric film wiring line laminated structure portion, the organic resin layer protecting at least one of the low dielectric films of the low dielectric film wiring line laminated structure portion from peeling off from an under layer or the upper surface of semiconductor substrate, wherein the under layer is formed by another one of the low dielectric films,
   wherein the low dielectric films of the low dielectric film wiring line laminated structure portion, the passivation film, and the upper portion of the organic resin layer respectively include a plurality of through openings for an electric connection of the active semiconductor elements, and
   wherein a side peripheral surface of the passivation film is located inward from the side peripheral surface of the low dielectric film wiring line laminated structure portion.

2. The semiconductor device according to claim 1, wherein the organic resin layer includes a sealing film and a protective film provided between the sealing film and the passivation film, and
   wherein the sealing film includes the side peripheral portion of the organic resin layer, and covers a side peripheral surface of the protective film.

3. The semiconductor device according to claim 2, wherein the side peripheral surface of the protective film is located inward from the side peripheral surface of the passivation film to expose a peripheral area thereof, and the sealing film is directly in contact with the peripheral area of the passivation film.

4. The semiconductor device according to claim 2, wherein the side peripheral surface of the passivation film is located inward from the side peripheral surface of the protective film, and the protective film directly covers the side peripheral surface of the passivation film.

5. The semiconductor device according to claim 1, wherein the passivation film is patterned using photolithography so that the side peripheral surface of the passivation film is located inward from the side peripheral surface of the low dielectric film wiring line laminated structure portion.

6. The semiconductor device according to claim 1, further comprising:
   a plurality of upper wiring lines which are provided on the upper portion of the organic resin layer, the upper wiring lines being electrically connected to the active semiconductor elements through the wiring lines of the low dielectric film wiring line laminated structure portion,
   wherein the upper portion and the side peripheral portion of the organic resin layer are made of the same material.

7. The semiconductor device according to claim 1, further comprising:
   a plurality of upper wiring lines which are provided on the upper portion of the organic resin layer, the upper wiring lines being electrically connected to the active semiconductor elements through the wiring lines of the low dielectric film wiring line laminated structure portion,
   wherein the upper portion of the organic resin layer and the side peripheral portion of the organic resin layer are made of different materials.

8. The semiconductor device according to claim 7 wherein the upper portion is made of polyimide, epoxy, phenol, bismaleimide, acryl, synthetic rubber, or polybenzooxide, and the side peripheral portion is made of an epoxy-based resin.

9. The semiconductor device according to claim 7, wherein the side peripheral surface of the passivation film is located inward from a side peripheral surface of the upper portion of the organic resin layer, so that the side peripheral surface of the passivation film is directly covered with the upper portion of the organic resin layer.

10. The semiconductor device according to claim 7, wherein the side peripheral portion of the organic resin layer includes a first portion directly covering the side peripheral surface of the passivation film, and a second portion directly covering the side peripheral surface of the low dielectric film wiring line laminated structure portion, and
wherein the first and second portions are made of the same organic resin material.

11. The semiconductor device according to claim 1, wherein the side peripheral portion of the organic resin layer includes a first portion directly covering the side peripheral surface of the passivation film, and a second portion directly covering the side peripheral surface of the low dielectric film wiring line laminated structure portion, and
wherein the first and second portions are made of different organic resin materials.

12. The semiconductor device according to claim 1, wherein the side peripheral surface of the passivation film is located inward from a side peripheral surface of the upper portion of the organic resin layer, so that the side peripheral surface of the passivation film is covered with the upper portion of the organic resin layer, and
wherein the side peripheral portion of the organic resin layer has an inner layer which directly contacts with the low dielectric film wiring line laminated structure portion, and an outer layer which covers the inner layer and is made of a different material from than the inner layer.

13. A semiconductor device comprising:
a semiconductor substrate including an upper surface and a plurality of active semiconductor elements;
a low dielectric film wiring line laminated structure portion which is provided on the upper surface of the semiconductor substrate, and which has a laminated structure including a plurality of low dielectric films and a plurality of wiring lines, each of the low dielectric films having a relative dielectric constant of 3.0 or lower, and at least one of said plurality of low dielectric films including a porous type film;
a passivation film made of an inorganic material and formed on an upper surface of the low dielectric film wiring line laminated structure portion;
an organic resin layer including an upper portion which covers an upper surface of the passivation film, and a side peripheral portion which covers a side peripheral surface of the low dielectric film wiring line laminated structure portion, the organic resin layer protecting at least one of the low dielectric films of the low dielectric film wiring line laminated structure portion from peeling off from an adjacent low dielectric film or the upper surface of the semiconductor substrate; and
a plurality of bump electrodes for external connection, formed on an upper side of the low dielectric film wiring line laminated structure portion,
wherein the side peripheral surface of the low dielectric film wiring line laminated structure portion is a cut surface which has been melted and cut by laser beam radiation,
wherein the low dielectric films of the low dielectric film wiring line laminated structure portion, the passivation film, and the upper portion of the organic resin layer respectively include a plurality of through openings for an electric connection of the active semiconductor elements, and
wherein a side peripheral surface of the passivation film is located inward from the side peripheral surface of the low dielectric film wiring line laminated structure portion.

14. The semiconductor device according to claim 13, wherein the passivation film is patterned using photolithography so that the side peripheral surface of the passivation film is located inward from the side peripheral surface of the low dielectric film wiring line laminated structure portion.

15. The semiconductor device according to claim 13, wherein side peripheral portion of the organic resin layer includes a first portion directly covering the side peripheral surface of the passivation film, and a second portion directly covering the side peripheral surface of the low dielectric film wiring line laminated structure portion, and
wherein the first and second portions are made of different organic resin materials.

16. The semiconductor device according to claim 13, wherein side peripheral portion of the organic resin layer includes a first portion directly covering the side peripheral surface of the passivation film, and a second portion directly covering the side peripheral surface of the low dielectric film wiring line laminated structure portion, and
wherein the first and second portions are made of the same organic resin material.

17. The semiconductor device according to claim 13, wherein a side peripheral surface of the semiconductor substrate is a cut surface which has been melted and cut by laser beam radiation, a portion of the cut surface being covered with the side peripheral portion of the organic resin layer.

18. A semiconductor device comprising:
a semiconductor substrate including an upper surface and a plurality of active semiconductor elements;
a low dielectric film wiring line laminated structure portion which is provided on the upper surface of the semiconductor substrate, and which has a laminated structure including a plurality of low dielectric films and a plurality of wiring lines, each of the low dielectric films having a relative dielectric constant of 3.0 or lower;
a passivation film made of an inorganic material and formed on an upper surface of the low dielectric film wiring line laminated structure portion;
an organic resin layer including an upper portion which covers an upper surface of the passivation film, and a side peripheral portion which covers a side peripheral surface of the low dielectric film wiring line laminated structure portion, so that the low dielectric film wiring line laminated structure portion is prevented from peeling off from the semiconductor substrate, or at least one low dielectric film is prevented from peeling off from an adjacent low dielectric film; and
a plurality of upper wiring lines formed on the upper portion of the organic resin layer and electrically connected to said plurality of active semiconductor elements through the low dielectric film wiring line laminated structure portion, wherein the side peripheral surface of the low dielectric film wiring line laminated structure portion is a cut surface which has been melted and cut by laser beam radiation, wherein the low dielectric films of the low dielectric film wiring line laminated structure portion, the passivation film, and the upper portion of the organic resin layer respectively include a plurality of through openings for an electric connection of the active semiconductor elements, and wherein a side peripheral surface of the passivation film is located inward from the side peripheral surface of the low dielectric film wiring line laminated structure portion and a side peripheral surface of the upper portion of the organic resin layer.

19. The semiconductor device according to claim 18 wherein the side peripheral portion of the organic layer directly contacts with the low dielectric film wiring line laminated structure portion, and wherein the upper portion and side peripheral portion of the organic resin layer are made of different materials.

20. The semiconductor device according to claim 18 wherein a side peripheral surface of the semiconductor substrate is a cut surface which has been melted and cut by laser beam radiation, a portion of the cut surface being covered with the side peripheral portion of the organic resin layer.

* * * * *